(12) United States Patent
Haneda

(10) Patent No.: US 11,916,560 B2
(45) Date of Patent: Feb. 27, 2024

(54) A/D CONVERTER, DIGITAL-OUTPUT TEMPERATURE SENSOR, CIRCUIT DEVICE, AND OSCILLATOR

(71) Applicant: Seiko Epson Corporation, Tokyo (JP)

(72) Inventor: Hideo Haneda, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 184 days.

(21) Appl. No.: 17/680,451

(22) Filed: Feb. 25, 2022

(65) Prior Publication Data

US 2022/0278691 A1 Sep. 1, 2022

(30) Foreign Application Priority Data

Feb. 26, 2021 (JP) ................ 2021-029710

(51) Int. Cl.
*H03M 1/06* (2006.01)
(52) U.S. Cl.
CPC ................ *H03M 1/0604* (2013.01)
(58) Field of Classification Search
CPC ...... H03M 1/06; H03M 1/201; H03M 1/1295; H03M 1/0604
See application file for complete search history.

(56) References Cited

U.S. PATENT DOCUMENTS 5,116,129 A * 5/1992 Ishigami ............ G01C 19/726
356/464
5,187,481 A * 2/1993 Hiller ................ H03H 21/0012
341/131
5,272,479 A * 12/1993 Silver .................. H03M 1/50
341/171

(Continued)

FOREIGN PATENT DOCUMENTS

JP 2019-020204 A 2/2019
JP 2019-070656 A 5/2019

OTHER PUBLICATIONS

Y. Chae, K. Souri, and K. A. A. Makinwa, "A 6.3 µW 20 bit incremental zoom ADC with 6 ppm INL and 1 µV offset," IEEE J. Solid-State Circuits, vol. 48, No. 12, pp. 3019-3027, Dec. 2013.

(Continued)

*Primary Examiner* — Lam T Mai
(74) *Attorney, Agent, or Firm* — Harness, Dickey & Pierce, P.L.C.

(57) ABSTRACT

The A/D converter includes a D/A conversion circuit configured to perform a D/A conversion on a DAC input digital value to output a DAC output signal, a difference output circuit for outputting difference signals based on a difference between the input signal and the DAC output signal, an A/D conversion circuit for performing an A/D conversion on the difference signals to output an ADC output digital value, and a control circuit for outputting the DAC input digital value based on the ADC output digital value. The control circuit outputs a first DAC input digital value and a second DAC input digital value different from the first DAC input digital value, and obtains ADC result data based on a first ADC output digital value obtained in accordance with the first DAC input digital value, a second ADC output digital value obtained in accordance with the second DAC input digital value, and the DAC input digital value.

13 Claims, 17 Drawing Sheets

(56) References Cited

U.S. PATENT DOCUMENTS

| | | | | |
|---|---|---|---|---|
| 5,493,298 A * | 2/1996 | Bartz | | H03M 1/201 |
| | | | | 341/131 |
| 5,825,318 A * | 10/1998 | Patapoutian | | G11B 5/5547 |
| | | | | 341/131 |
| 6,016,113 A * | 1/2000 | Binder | | H03M 1/207 |
| | | | | 341/131 |
| 6,323,791 B1 * | 11/2001 | Murden | | H03M 1/0607 |
| | | | | 341/120 |
| 6,567,022 B1 * | 5/2003 | Reuveni | | H03M 1/1028 |
| | | | | 341/120 |
| 6,894,632 B1 * | 5/2005 | Robinson | | H03M 1/005 |
| | | | | 341/143 |
| 7,583,215 B2 * | 9/2009 | Yamamoto | | H03M 3/406 |
| | | | | 341/143 |
| 7,589,658 B2 * | 9/2009 | Ren | | H03M 1/186 |
| | | | | 341/161 |
| 7,884,749 B2 * | 2/2011 | Furuta | | H03M 1/164 |
| | | | | 341/172 |
| 7,916,063 B1 * | 3/2011 | Portmann | | H03M 1/466 |
| | | | | 341/163 |
| 9,264,062 B1 * | 2/2016 | Kabir | | G01S 7/35 |
| 9,325,340 B2 | 4/2016 | Gonen et al. | | |
| 9,369,140 B1 * | 6/2016 | Sundaresan | | G01S 7/52025 |
| 9,509,326 B1 * | 11/2016 | Kauffman | | H03M 1/1009 |
| 10,038,453 B1 * | 7/2018 | George | | H03M 1/804 |
| 10,340,938 B1 * | 7/2019 | Eitan | | H03K 3/356191 |
| 10,396,811 B1 * | 8/2019 | Rankin | | H03M 1/0604 |
| 10,425,096 B1 * | 9/2019 | Haessig, Jr. | | H03M 1/201 |
| 11,057,041 B1 * | 7/2021 | Strijker | | H03M 1/0604 |
| 11,240,600 B1 * | 2/2022 | Mohammadi | | H03M 3/424 |
| 2002/0109620 A1 * | 8/2002 | Sakuragi | | H03M 1/16 |
| | | | | 341/164 |
| 2008/0129565 A1 * | 6/2008 | Gustat | | H03M 3/498 |
| | | | | 341/143 |
| 2009/0033528 A1 * | 2/2009 | Kimura | | H03M 1/109 |
| | | | | 341/120 |
| 2009/0237286 A1 * | 9/2009 | Sutardja | | H03M 1/1019 |
| | | | | 341/159 |
| 2010/0033362 A1 * | 2/2010 | Kitami | | H04N 25/447 |
| | | | | 341/169 |
| 2010/0171643 A1 * | 7/2010 | Hong | | H03M 3/37 |
| | | | | 341/118 |
| 2012/0112808 A1 * | 5/2012 | Yotsuji | | H03L 3/00 |
| | | | | 327/156 |
| 2012/0154194 A1 * | 6/2012 | Chang | | H03M 1/002 |
| | | | | 341/158 |
| 2015/0162935 A1 * | 6/2015 | Aaltonen | | H03M 3/368 |
| | | | | 341/143 |
| 2015/0188561 A1 * | 7/2015 | Narayan | | H03M 1/0695 |
| | | | | 341/118 |
| 2016/0054183 A1 | 2/2016 | Yayama | | |
| 2019/0190554 A1 * | 6/2019 | Srinivasan | | H04B 5/0056 |
| 2019/0334545 A1 * | 10/2019 | Quiquempoix | | H03M 3/464 |
| 2023/0170918 A1 * | 6/2023 | Huynh | | H03M 1/0626 |
| | | | | 341/138 |

OTHER PUBLICATIONS

B. Gönen, F. Sebastiano, R. Quan, R. Veldhoven, and K. A. A. Makinwa, "A Dynamic Zoom ADC With 109-dB DR for Audio Applications," IEEE J. Solid-State Circuits, vol. 52, No. 6, pp. 1542-1550, Jun. 2017.

* cited by examiner

A/D CONVERTER, DIGITAL-OUTPUT TEMPERATURE SENSOR, CIRCUIT DEVICE, AND OSCILLATOR

The present application is based on, and claims priority from JP Application Serial Number 2021-029710, filed Feb. 26, 2021, the disclosure of which is hereby incorporated by reference herein in its entirety.

BACKGROUND

1. Technical Field

The present disclosure relates to an A/D converter, a digital-output temperature sensor, a circuit device, an oscillator, and so on.

2. Related Art

In A/D converters for converting an input signal into a digital value, there is a demand for an increase in accuracy. For example, as related art for realizing an A/D converter having higher accuracy than the resolution of an A/D conversion circuit provided to the A/D converter, there is a technology disclosed in, for example, "Y. Chae, K. Souri, and K. A. A. Makinwa, "A 6.3 µW 20 bit incremental zoom ADC with 6 ppm INL and 1 µV offset," IEEE J. Solid-State Circuits, vol. 48, no. 12, pp. 3019-3027, December 2013" (Document 1).

In the related art in Document 1, a high-accuracy A/D converter is realized using two A/D conversion circuit, namely a Coarse ADC low in accuracy and a Fine ADC high in accuracy. However, a method of realizing the high-accuracy A/D converter using, for example, a single A/D conversion circuit has not been proposed.

SUMMARY

An aspect of the present disclosure relates to an A/D converter configured to perform an A/D conversion on an input signal to output ADC result data, the A/D converter including a D/A conversion circuit configured to perform a D/A conversion on a DAC input digital value to output a DAC output signal, a difference output circuit configured to output difference signals based on a difference between the input signal and the DAC output signal, an A/D conversion circuit configured to perform an A/D conversion on the difference signals to output an ADC output digital value, and a control circuit configured to output the DAC input digital value based on the ADC output digital value, wherein the control circuit is configured to output a first DAC input digital value and a second DAC input digital value different from the first DAC input digital value as the DAC input digital value, and obtain the ADC result data based on a first ADC output digital value as the ADC output digital value obtained in accordance with the first DAC input digital value, a second ADC output digital value as the ADC output digital value obtained in accordance with the second DAC input digital value, and the DAC input digital value.

Further, another aspect of the present disclosure relates to a digital-output temperature sensor including the A/D converter described above, and a temperature sensor circuit configured to detect temperature to output a temperature detection voltage, wherein the temperature detection voltage is input to the difference output circuit as the input voltage.

Further, another aspect of the present disclosure relates to a digital-output temperature sensor including the A/D converter described above, and a temperature sensor circuit configured to detect temperature to output a temperature detection current, wherein the temperature detection current is input to the difference output circuit as the input current.

Further, another aspect of the present disclosure relates to a circuit device including the digital-output temperature sensor described above, and an oscillation circuit configured to oscillate a resonator, wherein the digital-output temperature sensor detects ambient temperature of the resonator to output the ADC result data as temperature detection data.

Further, another aspect of the present disclosure relates to an oscillator including the circuit device described above, and the resonator.

DESCRIPTION OF AN EXEMPLARY EMBODIMENT

The present embodiment will hereinafter be described. It should be noted that the present embodiment described below does not unreasonably limit the contents set forth in the appended claims. Further, all of the constituents described in the present embodiment are not necessarily essential elements.

1. A/D Converter

Figure 1:
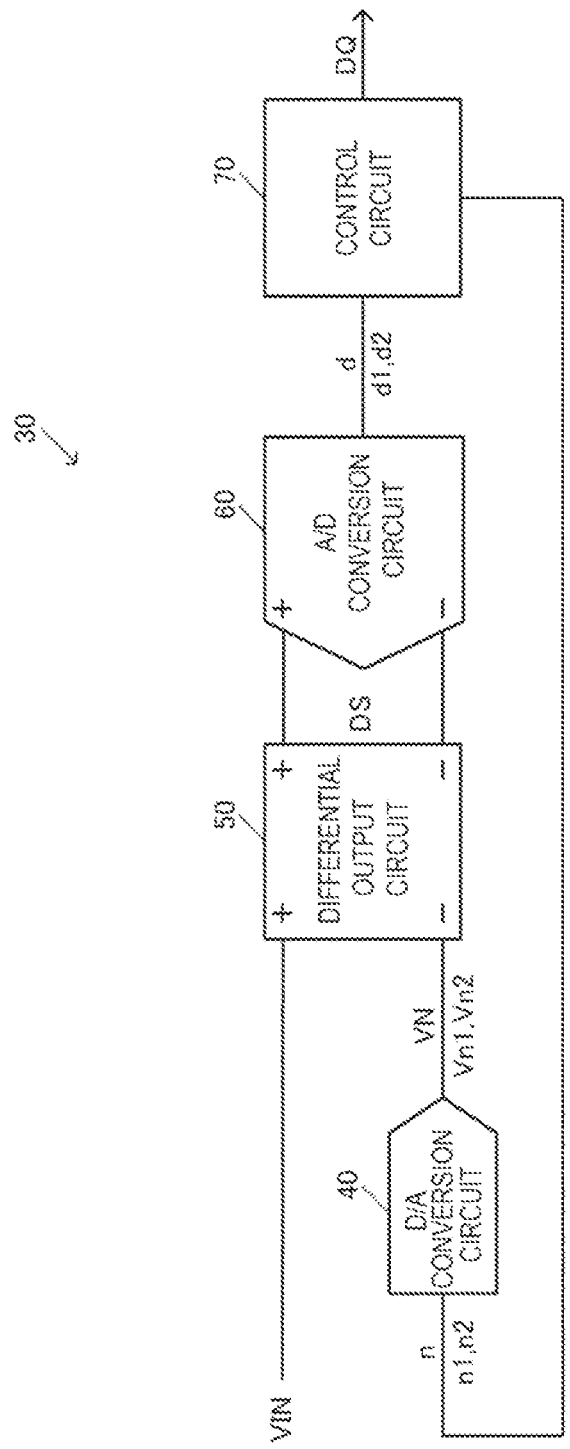
FIG. 1 is a diagram showing a configuration example of an A/D converter according to the embodiment.

FIG. 1 shows a configuration example of an A/D converter 30 according to the present embodiment. The A/D converter 30 performs the A/D conversion on the input signal VIN to output ADC result data DQ. In FIG. 1, the A/D converter 30 includes a D/A conversion circuit 40, a difference output circuit 50, an A/D conversion circuit 60, and a control circuit 70. It should be noted that the A/D converter 30 according to the present embodiment is not limited to the configuration shown in FIG. 1, but there can be adopted a variety of practical modifications such as elimination of some of the constituents, addition of other constituents, or replacement of the constituents with different types of constituents.

The D/A conversion circuit 40 performs the D/A conversion on DAC input digital values n to output a DAC output signal VN. As the D/A conversion circuit 40, it is desirable to use, for example, a resistor-ladder type D/A conversion circuit. It should be noted that in the present embodiment, it is possible to use a D/A conversion circuit of another type such as a capacitance array type, a delta-sigma type, or a current output type as the D/A conversion circuit 40. Further, the description will hereinafter presented citing when the input signal VIN and the DAC output signal VN are voltage signals as an example, but the input signal VIN and the DAC output signal VN can be current signals.

The difference output circuit 50 outputs difference signals DS based on a difference between the input signal VIN and the DAC output signal VN. In the difference output circuit 50, for example, the input signal VIN is input to a first input terminal of the differential input, the DAC output signal VN is input to a second input terminal of the differential input, and the difference signals DS of the input signal VIN and the DAC output signal VN are output to, for example, differential output terminals. The first input terminal is, for example, a non-inverting input terminal, and the second input terminal is, for example, an inverting input terminal. The difference signals DS are formed of, for example, a first difference signal corresponding to VIN−VN, and a second difference signal corresponding to VN−VIN.

The A/D conversion circuit 60 performs the A/D conversion on the difference signals DS to output ADC output digital values d. For example, in the A/D conversion circuit 60, the first difference signal of the difference signals DS is input to the first input terminal of the differential input, the second difference signal of the difference signals DS is input to the second input terminal of the differential input, and the ADC output digital values d obtained by performing the A/D conversion on the difference between the first difference signal and the second difference signal are output. As the A/D conversion circuit 60, it is desirable to use, for example, a successive-approximation type A/D conversion circuit. It should be noted that in the present embodiment, it is possible to use an A/D conversion circuit of another type such as a pipeline type except the successive-approximation type, or a delta-sigma type as the A/D conversion circuit 60.

The control circuit 70 outputs the DAC input digital values n. For example, the control circuit 70 outputs the DAC input digital values n based on the ADC output digital values d from the A/D conversion circuit 60. For example, the control circuit 70 executes arithmetic processing based on the ADC output digital values d to output the DAC input digital values n to the D/A conversion circuit 40. Further, the control circuit 70 outputs the ADC result data DQ as a conclusive result. In other words, a digital value of the ADC result data DQ is output. The control circuit 70 can be realized by a logic circuit.

Specifically, the control circuit 70 outputs the DAC input digital value n1 and the DAC input digital value n2 different from the DAC input digital value n1 as the DAC input digital values n. The DAC input digital value n1 is a first DAC input digital value, and the DAC input digital value n2 is a second DAC input digital value. Then, the control circuit 70 obtains the ADC result data DQ based on the ADC output digital value d1 as the ADC output digital value d obtained in accordance with the DAC input digital value n1, the ADC output digital value d2 as the ADC output digital value d obtained in accordance with the DAC input digital value n2, and the DAC input digital values n. For example, when one of the DAC input digital values n1, n2 can be obtained from the other thereof, the control circuit 70 obtains the ADC result data DQ from the ADC output digital value d1, the ADC output digital value d2, and one of the DAC input digital values n1, n2. The ADC output digital value d1 is a first ADC output digital value, and the ADC output digital value d2 is a second ADC output digital value.

For example, when the control circuit 70 outputs the DAC input digital value n1, the D/A conversion circuit 40 performs the D/A conversion of the DAC input digital value n1 to output the DAC output signal VN=Vn1. Then, the difference output circuit 50 outputs the difference signals DS based on the difference between the input signal VIN and the DAC output signal Vn1, and the A/D conversion circuit 60 performs the A/D conversion of the difference signals DS to thereby output the ADC output digital value d=d1 to the control circuit 70. Further, when the control circuit 70 outputs the DAC input digital value n2, the D/A conversion circuit 40 performs the D/A conversion of the DAC input digital value n2 to output the DAC output signal VN=Vn2. Then, the difference output circuit 50 outputs the difference signals DS based on the difference between the input signal VIN and the DAC output signal Vn2, and the A/D conversion circuit 60 performs the A/D conversion of the difference signals DS to thereby output the ADC output digital value d=d2 to the control circuit 70. Then, the control circuit 70 obtains the ADC result data DQ based on the ADC output digital values d1, d2, and the DAC input digital values n. For example, the control circuit 70 obtains the ADC result data DQ based on the ADC output digital values d1, d2, and the DAC input digital value n1 or the DAC input digital value n2, and then outputs the ADC result data DQ as a digital value of the conclusive ADC result.

As described above, the A/D converter 30 in the present embodiment performs the A/D conversion twice such as the A/D conversion based on the DAC input digital value n1 and the A/D conversion based on the DAC input digital value n2. Then, the ADC result data DQ as the conclusive result is calculated based on the ADC output digital value d1 as the A/D conversion result based on the DAC input digital value n1, and the ADC output digital value d2 as the A/D conversion result based on the DAC input digital value n2. Further, the ADC output digital value d1 can be obtained by the A/D conversion circuit 60 performing the A/D conversion on a difference between the input signal VIN and the DAC output signal Vn1 which is obtained by the D/A conversion circuit 40 performing the D/A conversion on the DAC input digital value n1. Further, the ADC output digital value d2 can be obtained by the A/D conversion circuit 60 performing the A/D conversion on a difference between the input signal VIN and the DAC output signal Vn2 which is obtained by the D/A conversion circuit 40 performing the D/A conversion on the DAC input digital value n2. In this way, it becomes possible to realize the A/D converter 30 capable of performing the A/D conversion having higher accuracy than the resolution of the A/D conversion circuit using the A/D conversion circuit 60 and the D/A conversion circuit 40. As an example, when the resolution of the A/D conversion circuit 60 is, for example, 15 through 16 bits, it becomes possible to increase the resolution by, for example, two bits to realize the A/D converter 30 with the resolution of, for example, 17 through 18 bits. Further, according to the present embodiment, it becomes possible to realize the A/D converter 30 having higher accuracy than the resolution of the A/D conversion circuit 60 using, for example, the single A/D conversion circuit 60 without using two A/D conversion circuits such as the Coarse ADC and the Fine ADC. For example, by performing the conversion twice with the settings of the A/D conversion circuit 60 and the D/A conversion circuit 40 changed, it becomes possible to moderate the precision requirement for an analog gain which becomes a challenge in a Two-step ADC using the Coarse ADC and the Fine ADC, and thus, it becomes possible to realize, for example, a linearity improvement and prevention of missing code.

Figure 2:
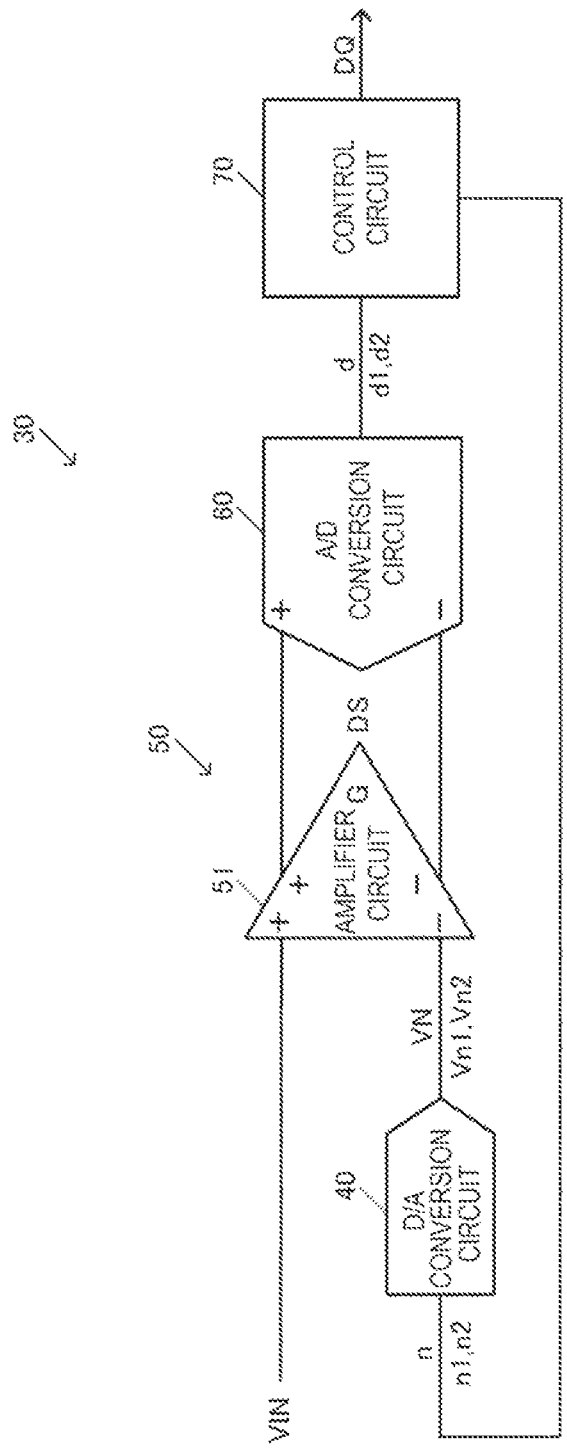
FIG. 2 is a diagram showing a configuration example of an A/D converter provided with an amplifier circuit as a difference output circuit.

FIG. 2 shows a configuration example of the A/D converter 30 in the present embodiment when providing an amplifier circuit 51 as the difference output circuit 50. In FIG. 2, the input signal VIN becomes an input voltage. Further, the D/A conversion circuit 40 outputs a DAC output voltage obtained by performing the D/A conversion on the DAC input digital value n as the DAC output signal VN. Specifically, the D/A conversion circuit 40 outputs the DAC output voltage obtained by performing the D/A conversion on the DAC input digital value n=n1 as the DAC output signal VN=Vn1, and outputs the DAC output voltage obtained by performing the D/A conversion on the DAC input digital value n=n2 as the DAC output signal VN=Vn2. Further, as the difference output circuit 50, there is disposed the amplifier circuit 51 for differentially amplifying the input signal VIN as the input voltage and the DAC output signal VN as the DAC output voltage. In FIG. 2, the amplifier circuit 51 differentially amplifies the input signal VIN and the DAC output signal VN with a gain G to output the difference signals DS as the differential voltage signals to the A/D conversion circuit 60. When providing such an amplifier circuit 51, it becomes possible to input the difference signals DS obtained by amplifying the difference between the input signal VIN and the DAC output signal VN to the A/D conversion circuit 60. Therefore, it becomes possible for the A/D conversion circuit 60 to perform the A/D conversion in, for example, full scale on the difference signals DS in a wide amplitude range amplified by the amplifier circuit 51, and thus it becomes possible to realize the high-accuracy A/D conversion. For example, by the A/D conversion circuit 60 performing the A/D conversion on the signal amplified by the amplifier circuit 51, it becomes possible to realize the A/D converter 30 higher in resolution than the A/D conversion circuit 60. It should be noted that the gain G as a gain of a signal of the amplifier circuit 51 can be set to, for example, 10 through 20 times.

Figure 3:
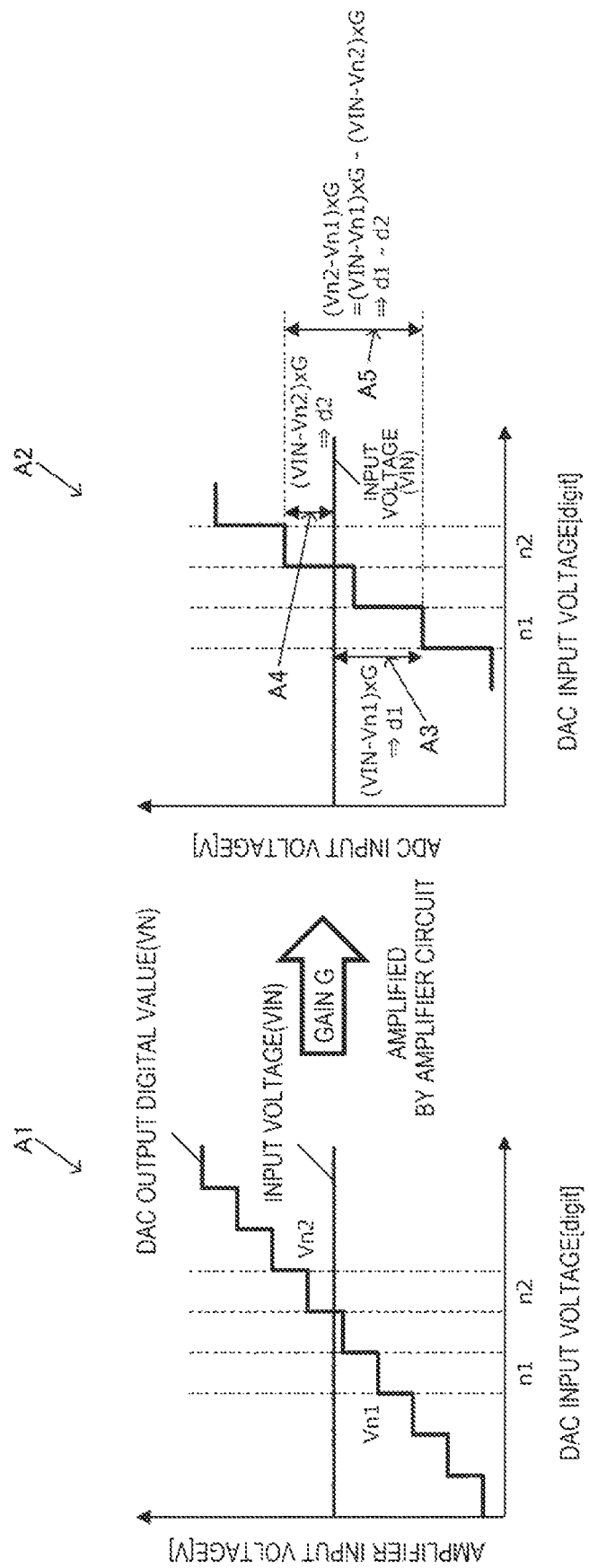
FIG. 3 is an operation explanatory diagram of the A/D converter.

FIG. 3 is an operation explanatory diagram of the A/D converter 30 in the present embodiment. A graph A1 in FIG. 3 shows a relationship between the input voltage and the DAC output voltage. The input voltage is a voltage of the input signal VIN, and the DAC output voltage is a voltage of the DAC output signal VN. The DAC input digital values n on the horizontal axis of the graph A1 in FIG. 3 are digital values to be input to the D/A conversion circuit 40, and the digital value is also called a digital code. As shown in the graph A1 in FIG. 3, in the D/A conversion circuit 40, when the DAC input digital value n1 is input, the DAC output voltage Vn1 is output to the amplifier circuit 51, and when the DAC input digital value n2 is input, the DAC output voltage Vn2 is output to the amplifier circuit 51. In the graph A1 in FIG. 3, the input voltage VIN of the A/D converter 30 takes a voltage value, for example, between the DAC output voltages Vn1, Vn2. It should be noted that in the present embodiment, the input signal VIN is arbitrarily described as the input voltage, the D/A conversion circuit 40 is arbitrarily described as DAC, and the A/D conversion circuit 60 is arbitrarily described as ADC.

A graph A2 in FIG. 3 shows a relationship between the input voltage and the ADC input voltages after the amplification by the amplifier circuit 51. The ADC input voltages are differential voltages as the voltages of the difference signals DS. In the graph A2 shown in FIG. 3, signal amplification with the gain G (G>1) is performed by the amplifier circuit 51.

As shown in the graph A1 in FIG. 3, when the DAC input digital value n1 is input to the D/A conversion circuit 40, the D/A conversion circuit 40 outputs the output voltage of Vn1. Then, as shown in the graph A2 in FIG. 3, the amplifier circuit 51 amplifies the difference voltage VIN-Vn1 between the input voltage VIN and the DAC output voltage Vn1 with the gain G to output the result to the A/D conversion circuit 60, and the A/D conversion circuit 60 performs the A/D conversion on the voltage of (VIN-Vn1)×G to output the ADC output digital value d1 to the control circuit 70. Further, as shown in the graph A1 in FIG. 3, when the DAC input digital value n2 is input to the D/A conversion circuit 40, the D/A conversion circuit 40 outputs the output voltage of Vn2. Then, as shown in the graph A2 in FIG. 3, the amplifier circuit 51 amplifies the difference voltage VIN-Vn2 between the input voltage VIN and the DAC output voltage Vn2 with the gain G to output the result to the A/D conversion circuit 60, and the A/D conversion circuit 60 performs the A/D conversion on the voltage of (VIN-Vn2)×G to output the ADC output digital value d2 to the control circuit 70.

Further, the control circuit 70 obtains the ADC result data DQ based on the ADC output digital value d1 input from the A/D conversion circuit 60 when outputting the DAC input digital value n1 to the D/A conversion circuit 40, and the ADC output digital value d2 input from the A/D conversion circuit 60 when outputting the DAC input digital value n2 to the D/A conversion circuit 40. For example, the difference voltage indicated by an arrow A3 in FIG. 3 is expressed as (VIN-Vn1)×G, which corresponds to the ADC output digital value d1. The difference voltage indicated by an arrow A4 is expressed as (VIN-Vn2)×G, which corresponds to the ADC output digital value d2. Further, the difference voltage indicated by an arrow A5 is expressed as follows, which corresponds to a difference d1-d2 between the ADC output digital values d1, d2.

$$(Vn2-Vn1) \times G = (VIN-Vn1) \times G - (VIN-Vn2) \times G$$

Therefore, the input voltage VIN of the A/D converter 30 can be identified from the ratios of the difference voltage indicated by the arrow A3 and the difference voltage indicated by the arrow A4 to the difference voltage indicated by the arrow A5. Specifically, the input voltage VIN can be identified as the following formula (1).

$$VIN = Vn1 + (Vn2 - Vn1)\frac{G(VIN - Vn1)}{G(Vn2 - Vn1)} \quad (1)$$
$$= Vn1 + (Vn2 - Vn1)\frac{d_1}{d_1 - d_2}$$

Therefore, it becomes possible for the control circuit 70 to calculate and then output the ADC result data DQ as the following formula (2).

$$DQ = n1 + (n2 - n1)\frac{d_1}{d_1 + d_2} \quad (2)$$

For example, when the input voltage VIN has a voltage value between Vn1 and Vn2, the input voltage VIN becomes a voltage expressed by a ratio d1/(d1−d2) between Vn1 and Vn2. For example, when d1/(d1−d2) is 0.5, VIN=Vn1+(Vn2−Vn1)×0.5 is achieved, and the input voltage VIN has a voltage value in the middle of Vn1 and Vn2. When d1/(d1−d2) is 0.6, VIN=Vn1+(Vn2−Vn1)×0.6 is achieved, and the input voltage VIN has a voltage value expressed by a ratio of 60% between Vn2 and Vn1. It should be noted that when the input voltage VIN is not a voltage between Vn1 and Vn2, it is possible to identify the input voltage VIN using the formula (1) described above, and it is possible for the control circuit 70 to obtain and then output the ADC result data DQ as expressed in the formula (2) described above.

According to the present embodiment, even when, for example, disposing the amplifier circuit 51 in the anterior stage of the A/D conversion circuit 60 in order to increase the resolution of the A/D conversion, it becomes difficult for the circuit characteristics of the amplifier circuit 51 as the amplification circuit to affect the result of the A/D conversion. For example, as shown in formulas (1), (2) described above, in theory, the gain G of the amplifier circuit 51 does not at all affect the result of the A/D conversion. Further, in the present embodiment, the control circuit 70 generates the DAC input digital values n based on the ADC output digital values d from the A/D conversion circuit 60. For example, the control circuit 70 generates the DAC input digital values n using feedback control. By performing such feedback control, it becomes possible to approximate the DAC output voltage VN of the D/A conversion circuit 40 to the input voltage VIN. For example, when the DAC output voltage VN and the input voltage VIN are too far from each other, it becomes difficult to obtain an accurate A/D conversion result, but by making the DAC output voltage VN close to the input value VIN, it becomes possible to increase the accuracy of the result of the A/D conversion.

As described hereinabove, in the present embodiment, when defining the first DAC input digital value as n1, the second DAC input digital value as n2, the first ADC output digital value as d1, the second ADC output digital value d2, and the ADC result data as DQ, the control circuit 70 obtains the ADC result data DQ using the following expression.

DQ=n1+(n2−n1)×d1/(d1−d2)

In other words, the control circuit 70 executes the following arithmetic processing based on the DAC input digital values n1, n2 and the ADC output digital values d1, d2 to thereby obtain the ADC result data DQ.

DQ=n1+(n2−n1)×d1/(d1−d2)

In this way, by the A/D conversion circuit 60 and the D/A conversion circuit 40 performing the conversion based on the DAC input digital value n1 and the conversion based on the DAC input digital value n2, and the control circuit 70 performing the following arithmetic processing, it becomes possible to realize the A/D converter 30 having higher accuracy than the resolution of the A/D conversion circuit 60.

DQ=n1+(n2−n1)×d1/(d1−d2)

Figure 4:
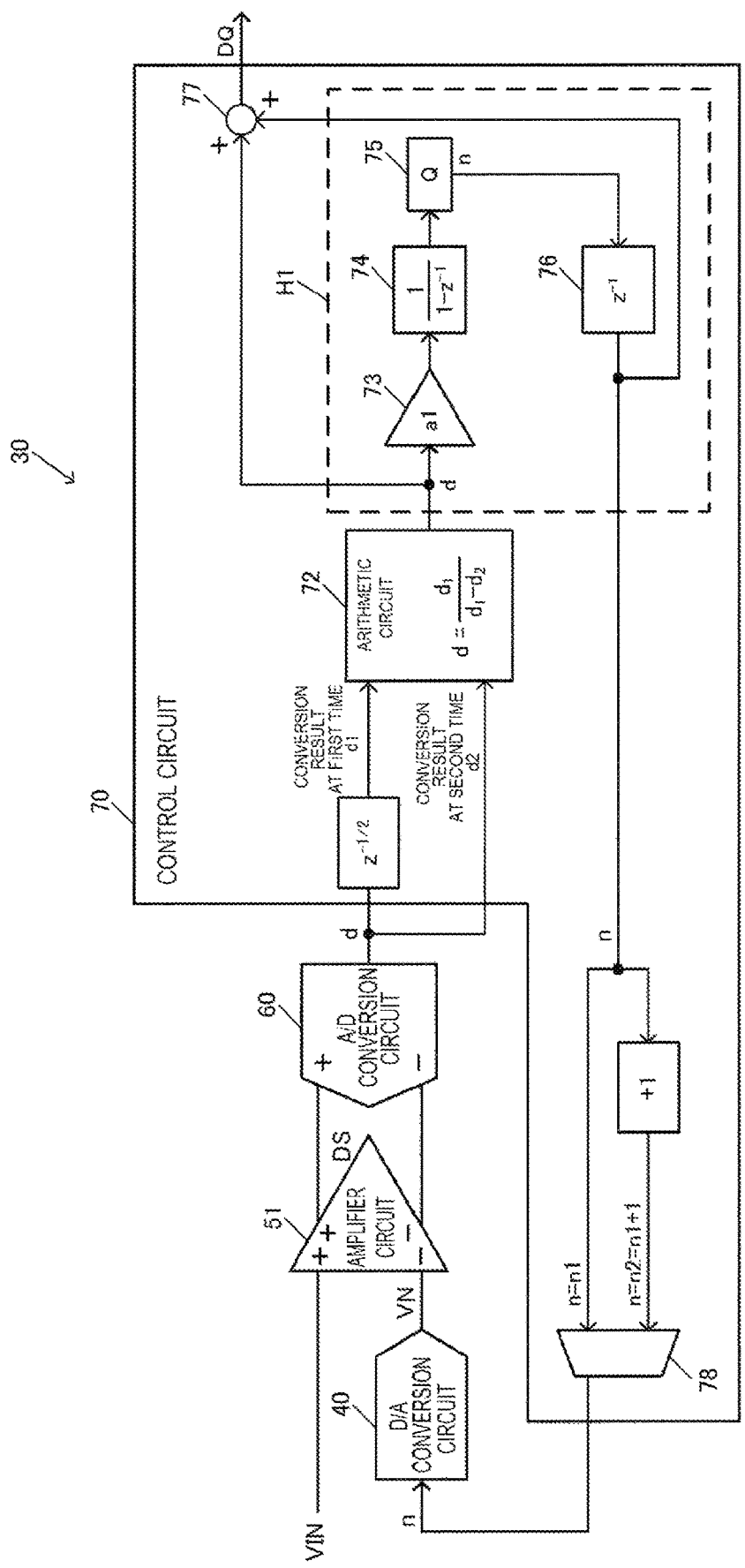
FIG. 4 is a diagram showing a detailed configuration example of the A/D converter according to the present embodiment.
Figure 5:
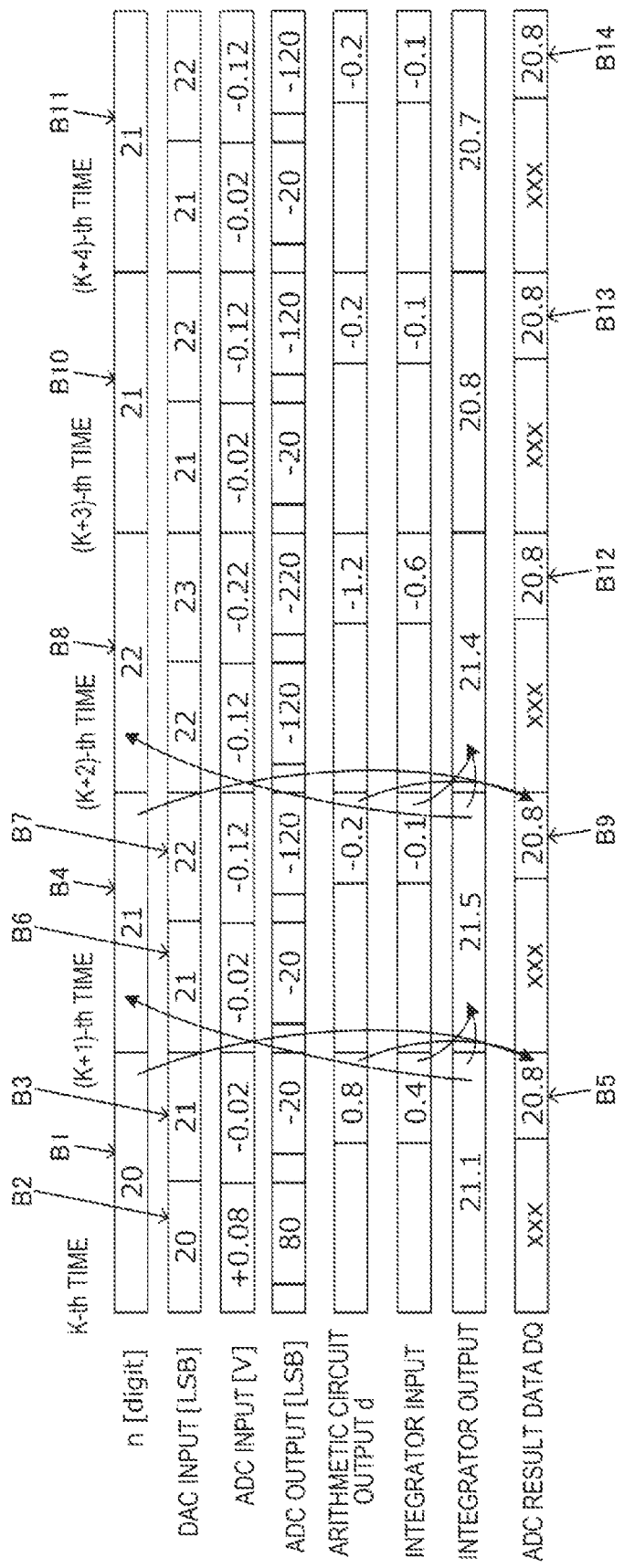
FIG. 5 is a detailed operation explanatory diagram of the A/D converter.
Figure 6:
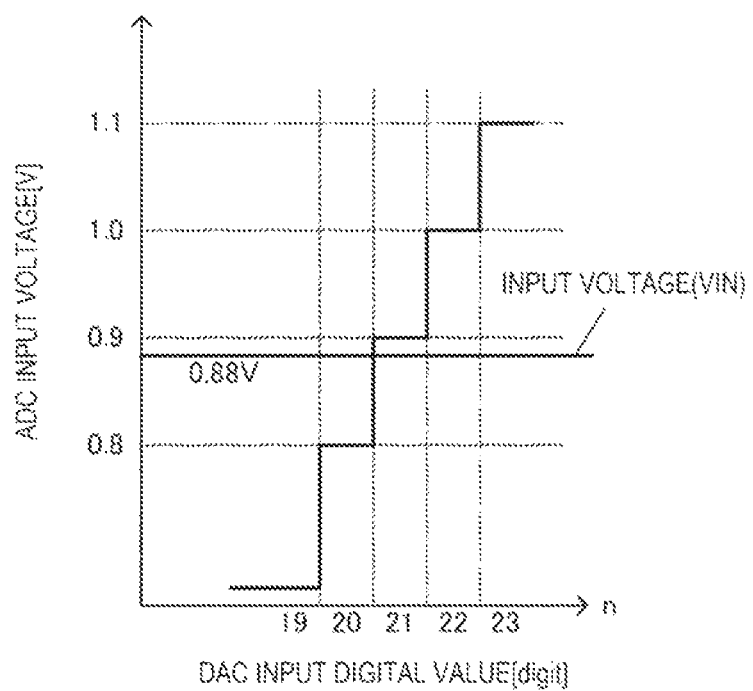
FIG. 6 is a diagram showing an example of a relationship between an input voltage and an ADC input voltage.

FIG. 4 shows a detailed configuration example of the A/D converter 30 according to the present embodiment. FIG. 4 shows a specific configuration example of the control circuit 70. Further, FIG. 5 shows a detailed operation explanatory diagram of the A/D converter 30. It is assumed here that the input voltage VIN of, for example, 0.88 V is input as shown in FIG. 6.

In the k-th processing (k is an integer no smaller than 1) indicated by an arrow B1 in FIG. 5, a delay device 76 of the control circuit 70 shown in FIG. 4 outputs n=20. Then, as indicated by arrows B2, B3, n=20 is output to the D/A conversion circuit 40 by a selector 78 of the control circuit 70 in the first time, and n=21 is output to the D/A conversion circuit 40 in the second time. When n=20 is input to the D/A conversion circuit 40, +0.08 V, for example, is input to the A/D conversion circuit 60, and the A/D conversion circuit 60 outputs a digital value of, for example, 80. Here, 1 LSB is defined as, for example, 1 mV. Further, when n=21 is input to the D/A conversion circuit 40, −0.02 V, for example, is input to the A/D conversion circuit 60, and the A/D conversion circuit 60 outputs a digital value of, for example, −20. Then, an arithmetic circuit 72 of the control circuit 70 performs arithmetic processing of d=d1/(d1−d2) to output d=80/{80−(−20)}=0.8. A gain multiplier 73 of the control circuit 70 multiplies d=0.8 by the gain of, for example, a1=0.5, and 0.8×0.5=0.4 is input to an integrator 74 of the control circuit 70. On this occasion, the integrator 74 outputs an integration result of 21.1, and a quantizer 75 of the control circuit 70 performs quantization of converting 21.1 into an integer to output n=21 as n to be used for (k+1)-th processing as indicated by an arrow B4. Further, as indicated by an arrow B5, an adder 77 of the control circuit 70 performs add processing on n=20 used for the k-th processing and d=0.8 as the output of the arithmetic circuit 72 in the k-th processing to output DQ=20.8 as the ADC result data.

Further, as indicated by the arrow B4, in the (k+1)-th processing, the delay device 76 outputs n=21 which is obtained by the quantization in the k-th processing. Then, as indicated by arrows B6, B7, n=21 is output to the D/A conversion circuit 40 by the selector 78 in the first time, and n=22 is output to the D/A conversion circuit 40 in the second time. When n=21 is input to the D/A conversion circuit 40, −0.02 V, for example, is input to the A/D conversion circuit 60, and the A/D conversion circuit 60 outputs a digital value of, for example, −20. Further, when n=22 is input to the D/A conversion circuit 40, −0.12 V, for example, is input to the A/D conversion circuit 60, and the A/D conversion circuit 60 outputs a digital value of, for example, −120. Then, the arithmetic circuit 72 performs the arithmetic processing of d=d1/(d1−d2) to output d=−20/{20−(−120)}=−0.2. The gain multiplier 73 multiplies d=−0.2 by the gain of a1=0.5, and −0.2×0.5=−0.1 is input to the integrator 74. On this occasion, the integrator 74 outputs 21.5 which is a value obtained by adding 0.4 as the k-th integrator input to 21.1 as the k-th integration result. Then, the quantizer 75 performs quantization of converting 21.5 into an integer to output n=22 as n to be used for (k+2)-th processing as indicated by an arrow B8. Further, as indicated by an arrow B9, the adder 77 performs add processing on n=21 used for the (k+1)-th processing and d=−0.2 as the output of the arithmetic circuit 72 in the (k+1)-th processing to output DQ=20.8 as the ADC result data.

As described above, in the present embodiment, it becomes to be arranged that as indicated by the arrows B1, B4, B8, B10, and B11 in FIG. 5, the modulation such as the delta-sigma modulation on the DAC input digital values n is performed, and the DAC input digital values n thus modulated are input to the D/A conversion circuit 40. Further, as indicated by the arrow B5, B9, B12, B13, and B14, it becomes to be arranged that the ADC result data DQ corresponding to the input voltage VIN=0.88 V shown in FIG. 6 is output from the control circuit 70. For example, in FIG. 3, when a voltage difference between the DAC output voltage corresponding to the DAC input digital value n and the input voltage VIN becomes large, the difference voltage of the difference signals DS to be input to the A/D conversion circuit 60 becomes large. Then, when the difference voltage exceeds the full-scale range of the A/D conversion circuit 60, there arises a problem that an accurate A/D conversion becomes unachievable. In this regard, in FIG. 4 and FIG. 5, when the voltage difference between the DAC output voltage and the input voltage VIN is large, the feedback control is performed so that the voltage difference between the DAC output voltage and the input voltage VIN decreases due to the integration processing by the integrator 74 and so on, and the DAC input digital values n are output from the control circuit 70. Therefore, it is possible to prevent the situation in which the difference voltage of the difference signals DS increases to exceed the full-scale range of the A/D conversion circuit 60, and it becomes possible to realize the increase in accuracy of the A/D converter 30.

As described hereinabove, in the present embodiment, the control circuit 70 includes the arithmetic circuit 72, the integrator 74, and the quantizer 75, wherein the arithmetic circuit 72 performs the calculation of obtaining d=d1/(d1−d2) based on the ADC output digital values d1, d2, the integrator 74 performs the integration processing on the output of the arithmetic circuit 72, and the quantizer 75 performs the quantization processing on the result of the integration processing to output the DAC input digital values n. In this way, it becomes possible to perform the modulation such as the delta-sigma modulation on the DAC input digital values n. Thus, the DAC input digital value n to the D/A conversion circuit 40 becomes to be prevented from being fixed to a single value, and it is possible to improve the linearity and the differential characteristic of the D/A conversion circuit 40. Further, it becomes possible to autonomously and automatically determine the DAC input digital values n.

Figure 7:
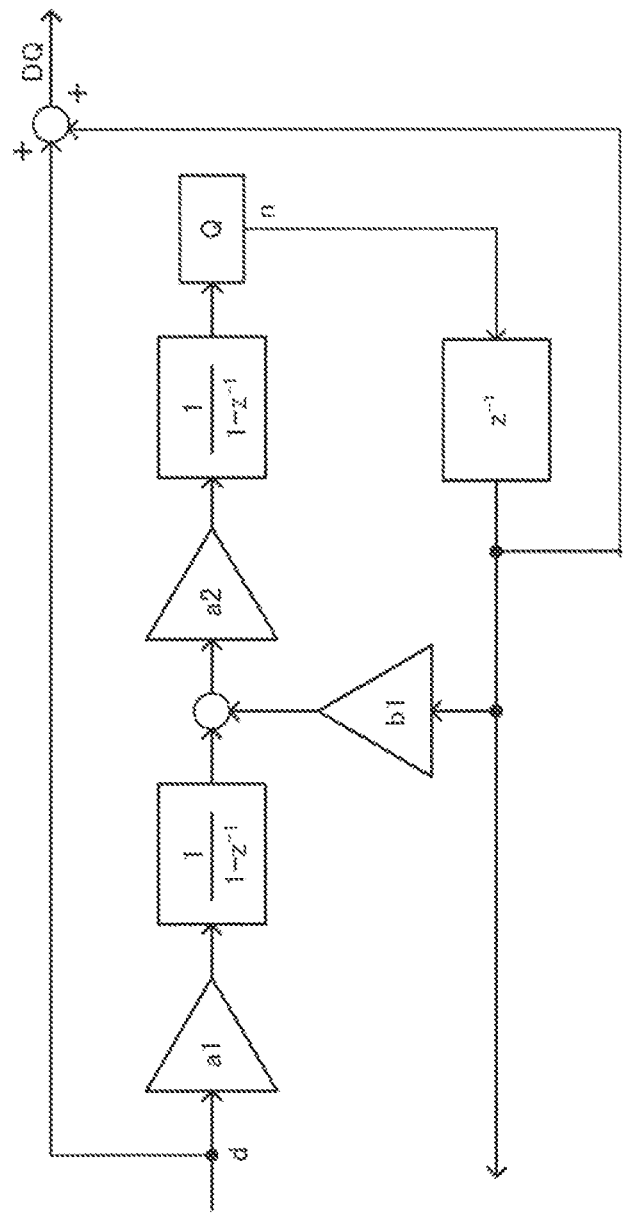
FIG. 7 is a diagram showing a configuration example when performing a modulation corresponding to a second-order delta-sigma modulation.

It should be noted that in a circuit block H1 shown in FIG. 4, the modulation corresponding to a first-order delta-sigma modulation is performed, but the modulation processing in the present embodiment is not limited thereto. There can be adopted a variety of modified implementations such as performing a modulation corresponding to such a second-order delta-sigma modulation as shown in FIG. 7.

Further, the control circuit 70 outputs the DAC input digital value n2 obtained by adding a predetermined value to the DAC input digital value n1. For example, in FIG. 4, the control circuit 70 outputs the DAC input digital value n2 obtained by adding +1 as the predetermined value to the DAC input digital value n1. Here, the predetermined value is not limited to +1, but can be a value no smaller than 2, or can also be a negative value. In this way, by such simple processing as adding the predetermined value, it becomes possible to output the DAC input digital values n1, n2 to the D/A conversion circuit 40, and output the ADC output digital value d1 corresponding to the DAC input digital value n1 and the ADC output digital value d2 corresponding to the DAC input digital value n2 from the A/D conversion circuit 60.

Figure 8:
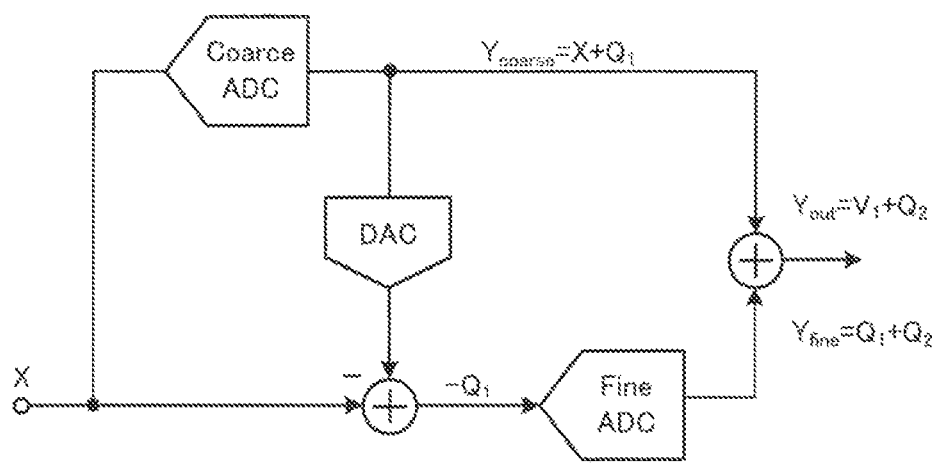
FIG. 8 is a diagram showing a configuration example of a related-art A/D converter.

For example, FIG. 8 shows a configuration example of a Two-step ADC as related-art. In FIG. 8, the conversion is performed by two ADCs in two stages. First, the Coarse ADC in the anterior stage performs a conversion, and then the result is transmitted to the DAC to generate a conversion residue voltage. Then, the Fine DAC in the posterior stage performs the conversion to thereby achieve the increase in accuracy. The net conversion accuracy is determined by the Fine ADC. Therefore, by adding a circuit for amplifying the conversion residue voltage, the resolution of the Fine ADC is improved. However, a lot of factors for generating an error exist in this configuration. For example, when a mismatch exists between the Coarse ADC and the DAC, it results in a difference between the conversion residue voltage and an actual value, and such an error as an linearity error or a missing code occurs. Further, all of such errors as a gain error, an offset, and the linearity error in the amplifier to be added in order to increase the accuracy of the Fine ADC affect the nonlinearity error of the ADC. Further, when a mismatch in full scale or an offset exists between the two ADCs, the nonlinearity or the missing code is generated due to an influence thereof.

Further, in a Zoom ADC as an improved example of the Two-step ADC, a DAC is involved in the Fine ADC to thereby eliminate the influence of the mismatch in the conversion residue voltage. Further, by adopting an SAR-ADC in the Coarse ADC to share the DAC with the SAR-ADC, the influence of the mismatch is further reduced. According to this configuration, the DAC is involved in the Fine ADC, and the Fine ADC takes a configuration of a delta-sigma type ADC, and can therefore be made high-accuracy. However, when widening the band, it is necessary to increase the sampling rate to raise the oversampling ratio, and there is a problem that it is difficult to widen the bandwidth. Further, the delta-sigma type A/D conversion circuit has an integrator structure in which an amplifier is used in the circuit, and therefore, generates the 1/f noise. Therefore, there is also a problem that the 1/f noise is superimposed on the conversion result of the ADC.

In this regard, in the present embodiment, the A/D converter 30 high in accuracy, and higher in resolution than the A/D conversion circuit 60 is realized using the A/D conversion circuit 60 and the D/A conversion circuit 40 instead of realizing the increase in accuracy using the two A/D conversion circuits as in the Two-step ADC shown in FIG. 8. In other words, as described with reference to FIG. 5 and so on, by performing the conversion twice with the DAC input digital value n changed using the A/D conversion circuit 60 and the D/A conversion circuit 40, it is possible to moderate the precision requirement for the analog gain which has been a challenge in the Two-step ADC, and it is possible to realize the improvement of the linearity and the prevention of the missing code. For example, in the present embodiment, also when disposing the amplifier circuit 51 in the anterior stage of the A/D conversion circuit 60 in order to increase the resolution of the A/D conversion, since the gain G of the amplifier circuit 51 does not affect the result of the A/D conversion as described with reference to the formula (1), (2) described above, it is possible to realize the increase in accuracy. Further, since it is not required to provide such two A/D conversion circuits as the Coarse ADC and the Fine ADC in the related art, the generation of the error due to the mismatch between the two A/D conversion circuit does not occur. Further, in the Zoom ADC, since the delta-sigma type A/D conversion circuit is used, there is a problem that it is difficult to widen the bandwidth. In contrast, in the A/D converter 30 in the present embodiment, since it is possible to use the A/D conversion circuit which can perform the wide-band operation such as the successive-approximation type A/D conversion circuit as the A/D conversion circuit 60, there is an advantage that it is easy to realize the increase in bandwidth.

Figure 9:
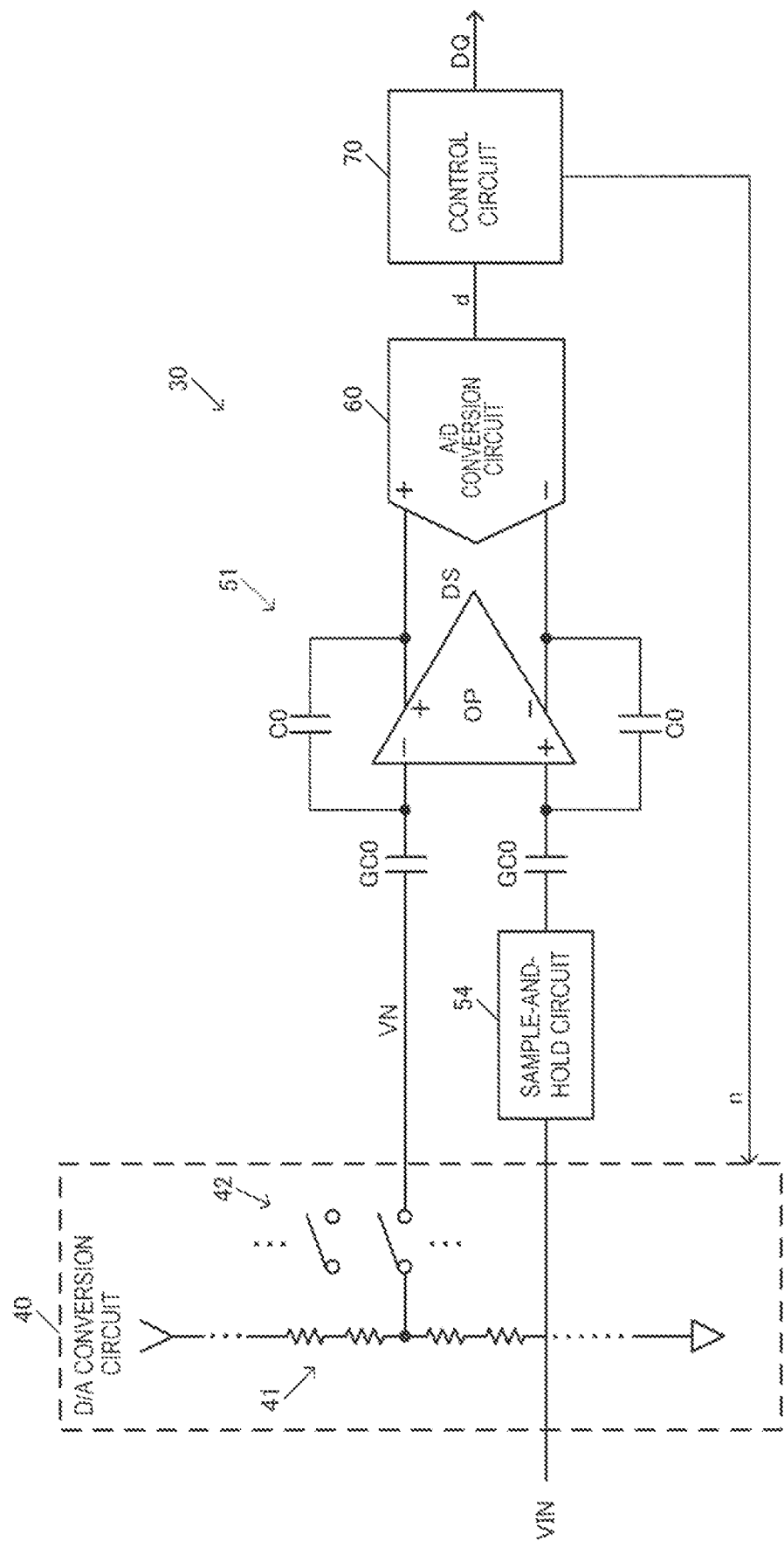
FIG. 9 is a diagram showing a configuration example of an A/D converter using a resistor-ladder type D/A conversion circuit.
Figure 10:
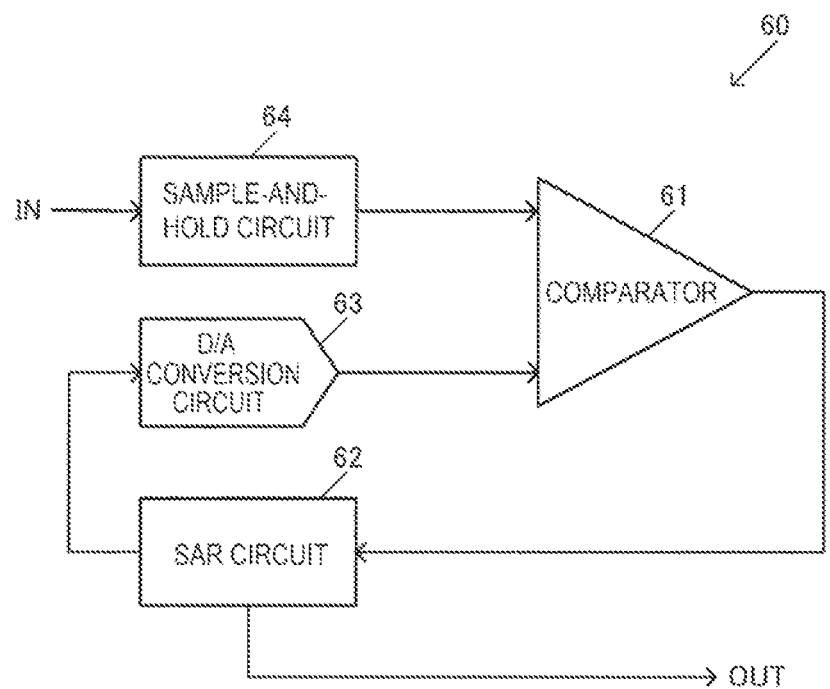
FIG. 10 is a diagram showing a configuration example of a successive-approximation type A/D conversion circuit.

Further, in the present embodiment, it is desirable for the D/A conversion circuit 40 to be the resistor-ladder type D/A conversion circuit. FIG. 9 shows a configuration example of the A/D converter 30 in this case. As shown in FIG. 9, the D/A conversion circuit 40 of the resistor-ladder type includes a ladder resistor circuit 41 and a switch array 42. The ladder resistor circuit 41 includes a plurality of resistors disposed in series between a power supply node at a high potential side and a power supply node at a low potential side. The switch array 42 as a voltage selection circuit includes a plurality of switches each set to the ON state or the OFF state with the DAC input digital value n from the control circuit 70. Further, in the switch array 42, a plurality of divisional voltages from a plurality of divisional voltage nodes of the ladder resistor circuit 41 is input, and the voltage selected by ON/OFF control of the plurality of switches by the DAC input digital value n is output as the DAC output signal VN which is the DAC output voltage. Further, in FIG. 9, the amplifier circuit 51 includes an operational amplifier OP and a plurality of capacitors. Further, the amplifier circuit 51 performs the differential amplification of the DAC output signal VN and the input signal VIN with the gain G set by the capacitance ratio of the capacitors to output the difference signals DS to the A/D conversion circuit 60. On this occasion, the input signal VIN is sampled and held by a sample-and-hold circuit 54, and is then input to the amplifier circuit 51. It should be noted that when a change rate of the input signal VIN is sufficiently low compared to a conversion rate of the A/D conversion circuit 60, the configuration of the sample-and-hold circuit 54 can be omitted.

For example, as is obvious from the formulas (1), (2) described above and FIG. 3, when the characteristic of the linearity such as INL (Integral Non-Linearity) of the D/A conversion circuit 40 is poor, the accuracy of the A/D converter 30 deteriorates. For example, the ADC result data DQ can be obtained by the following arithmetic expression as shown in the formula (2) described above, but when the characteristic of the linearity of the D/A conversion circuit 40 is poor, the premise of this arithmetic expression collapses, and it becomes difficult to realize the high-accuracy A/D converter 30.

$$DQ=n1+(n2-n1)\times d1/(d1-d2)$$

In this regard, in FIG. 9, the resistor-ladder type D/A conversion circuit is used as the D/A conversion circuit 40. The D/A conversion circuit 40 of the resistor-ladder type performs the D/A conversion based on the ratios of the resistance values of the plurality of resistors in the ladder resistor circuit 41, and is therefore superior in the characteristic of the linearity such as INL to D/A conversion circuits of other types. For example, by making the layout and so on of the plurality of resistors appropriate, it is possible to realize an excellent characteristic of the linearity. Therefore, by using the resistor-ladder type D/A conversion circuit as the D/A conversion circuit 40, it becomes possible to perform the accurate conversion corresponding to the theoretical formulas (1), (2) described above, and thus, it becomes possible to realize the high-accuracy A/D converter 30.

Further, in the present embodiment, it is desirable to use the successive-approximation type A/D conversion circuit as the A/D conversion circuit 60. FIG. shows a configuration example of the A/D conversion circuit 60 of the successive-approximation type. An SAR circuit 62 as a control circuit of a successive approximation (Successive Approximation Register) has a successive-approximation register to which register value is set by a comparison result signal from a comparator 61, and outputs successive-approximation data to a D/A conversion circuit 63. The D/A conversion circuit 63 performs the D/A conversion of the successive-approximation data to output a DAC output signal corresponding to the successive-approximation data to the comparator 61. The comparator 61 as a comparison circuit compares the input signal IN sampled and held by the sample-and-hold circuit 64 and the DAC output signal from the D/A conversion circuit 63 with each other to output a comparison result signal to the SAR circuit 62. Then, when the comparator 61 has performed the successive approximation process from the MSB to the LSB, the result of the comparison processing at each bit is stored as a register value of a corresponding bit of the successive approximation register provided to the SAR circuit 62. Then, the SAR circuit 62 outputs a result signal OUT of the conclusive A/D conversion by the successive approximation. It should be noted that as the D/A conversion circuit 63 of the A/D conversion circuit 60 of the successive-approximation type, there can be used, for example, a D/A conversion circuit of a charge-redistribution type as a capacitor-array type, and in this case, a function of the sample-and-hold circuit 64 is realized by the D/A conversion circuit 63 in reality. The D/A conversion circuit 63 of the charge-redistribution type is realized by, for example, a comparator a non-inverting input terminal of which is set to a common voltage, a capacitor array and a switch array which are coupled in series to an inverting input terminal of the comparator, and a control circuit for performing ON/OFF control of a plurality of switches of the switch array. As described above, by using the successive-approximation type A/D conversion circuit as the A/D conversion circuit 60, it becomes possible to perform the wide-band A/D conversion, and it becomes easy to realize the increase in bandwidth of the A/D converter 30.

Figure 11:
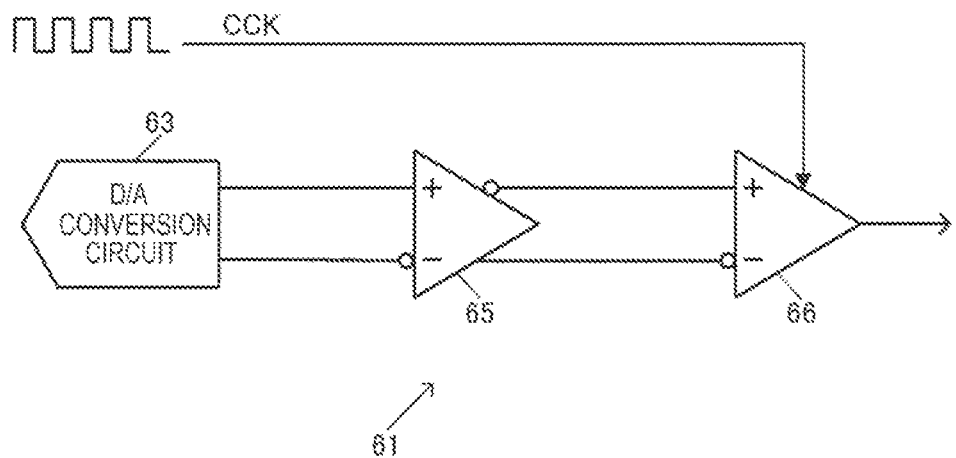
FIG. 11 is a diagram showing a first configuration example of a comparator of the successive-approximation type A/D conversion circuit.

Here, the comparator 61 can be constituted by a preamplifier circuit 65, and a dynamic-latch type comparator 66 as a comparison circuit which operates with a clock signal CCK input thereto as shown in, for example, FIG. 11. In FIG. 11, by providing the preamplifier circuit 65, a sufficient gain for comparing a voltage of the LSB is ensured.

Figure 12:
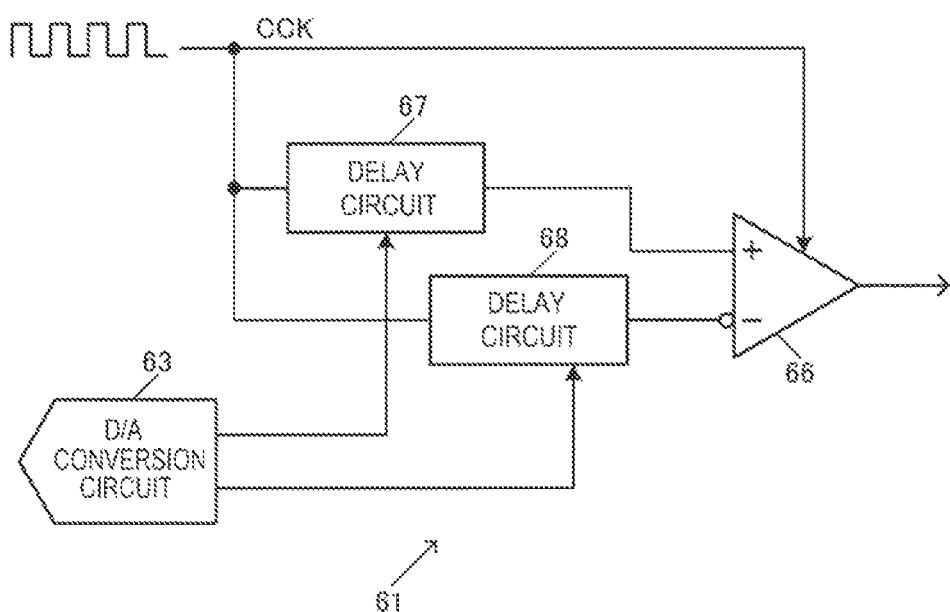
FIG. 12 is a diagram showing a second configuration example of the comparator of the successive-approximation type A/D conversion circuit.

It should be noted that as shown in FIG. 12, as the comparator 61, it is desirable to use an amplifier-less comparator which does not have the preamplifier 65 as shown in FIG. 11. This is because, by using the amplifier-less comparator 61, it is possible to prevent the accuracy of the A/D conversion from decreasing due to a noise generated in the preamplifier circuit 65. The amplifier-less comparator 61 shown in FIG. 12 generates a first pulse signal with a first pulse width corresponding to a voltage of a first output signal of differential output signals of the D/A conversion circuit 63, and a second pulse signal with a second pulse width corresponding to a voltage of a second output signal of the differential output signals of the D/A conversion circuit 63, then compares the first pulse width and the second pulse width to each other, and then outputs the comparison result signal. The comparison result signal is the signal of the comparison result of the voltage of the first output signal and the voltage of the second output signal of the D/A conversion circuit 63.

Specifically, as shown in FIG. 12, the comparator 61 includes delay circuits 67, 68, and the dynamic-latch type comparator 66. The delay circuit 67 corresponds to a first delay circuit, and the delay circuit 68 corresponds to a second delay circuit.

The delay circuit 67 delays a falling edge of the clock signal CCK as an input pulse signal in accordance with the voltage of the first output signal from the D/A conversion circuit 63 to thereby output the first pulse signal with the first pulse width corresponding to the voltage of the first output signal. The higher the voltage of the first output signal is, the shorter the delay time is. In other words, the higher the voltage of the first output signal is, the shorter the first pulse width becomes. In contrast, the delay circuit 68 delays the falling edge of the clock signal CCK in accordance with the voltage of the second output signal from the D/A conversion circuit 63 to thereby output the second pulse signal with the second pulse width corresponding to the voltage of the second output signal. The higher the voltage of the second output signal is, the shorter the delay time is. In other words, the higher the voltage of the second output signal is, the shorter the second pulse width becomes.

The dynamic-latch type comparator 66 as the comparison circuit latches a logic level of the second pulse signal from the delay circuit 68 using the falling edge of the first pulse signal from the delay circuit 67, and outputs the signal thus latched as the comparison result signal. When (the voltage of the first output signal)>(the voltage of the second output signal) is true, (the first pulse width)<(the second pulse width) becomes true, and therefore, a high level is latched with the falling edge of the first pulse signal. When (the voltage of the first output signal)<(the voltage of the second output signal) is true, (the first pulse width)>(the second pulse width) becomes true, and therefore, a low level is latched with the falling edge of the first pulse signal. In this way, the dynamic-latch type comparator 66 compares the first pulse width and the second pulse width to each other, and then outputs the comparison result signal as the signal of the result of the comparison between the voltages of the first output signal and the second output signal of the D/A conversion circuit 63.

2. Digital-Output Temperature Sensor

Figure 13:
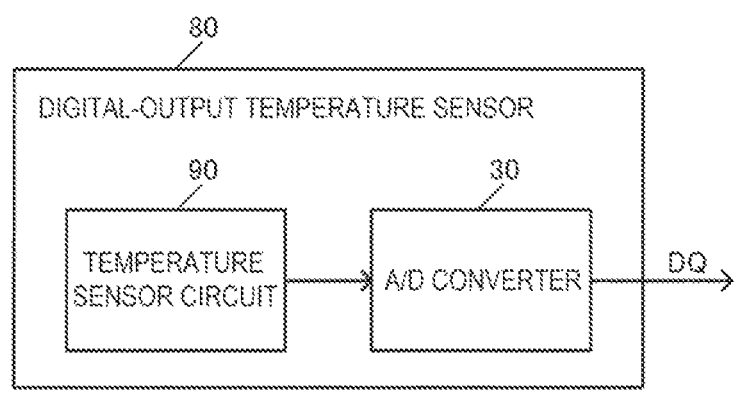
FIG. 13 is a diagram showing a configuration example of a digital-output temperature sensor.

FIG. 13 shows a configuration example of a digital-output temperature sensor 80 according to the present embodiment. The digital-output temperature sensor 80 includes the A/D converter 30 according to the present embodiment, and a temperature sensor circuit 90 for detecting temperature to output a temperature detection signal. The temperature detection signal from the temperature sensor circuit 90 is input to the A/D converter 30, and the A/D converter 30 performs the A/D conversion of the temperature detection signal to output the ADC result data DQ. In this way, it is possible to realize the digital-output temperature sensor 80 capable of outputting the temperature detection result of the temperature sensor circuit 90 as the ADC result data DQ as a digital value.

In this case, the temperature detection signal which is output by the temperature sensor circuit 90 after detecting the temperature can be a temperature detection voltage, or can also be a temperature detection current. Further, when the temperature detection signal is the temperature detection voltage, the temperature detection voltage becomes to be input to the difference output circuit of the A/D converter 30 according to the present embodiment shown in FIG. 1 as the input voltage as the input signal VIN. Thus, it is possible to realize the digital-output temperature sensor 80 which can convert the temperature detection voltage as the temperature detection result of the temperature sensor circuit 90 into the ADC result data DQ as a digital value, and then output the result. On the other hand, when the temperature detection signal is the temperature detection current, the temperature detection current becomes to be input to the difference output circuit 50 of the A/D converter 30 according to the present embodiment shown in FIG. 1 as an input current as the input signal VIN. Thus, it is possible to realize the digital-output temperature sensor 80 which can convert the temperature detection current as the temperature detection result of the temperature sensor circuit 90 into the ADC result data DQ as a digital value, and then output the result.

The A/D converter 30 according to the present embodiment is suitable as an A/D converter to be used in such a digital-output temperature sensor 80. For example, in the digital-output temperature sensor 80, it is necessary to output a high-accuracy temperature detection result. In this regard, in the A/D converter 30 according to the present embodiment, since it becomes possible to perform the A/D conversion having the higher accuracy than the resolution of the A/D conversion circuit 60, it is possible to meet the requirement of the output of such a high-accuracy temperature detection result. Further, in the digital-output temperature sensor 80, it is necessary to output the wideband high-accuracy temperature detection result. According to the A/D converter 30 in the present embodiment, since it is easy to widen the bandwidth as described above, it is possible to meet the demand of outputting the wideband high-accuracy temperature detection result.

Figure 14:
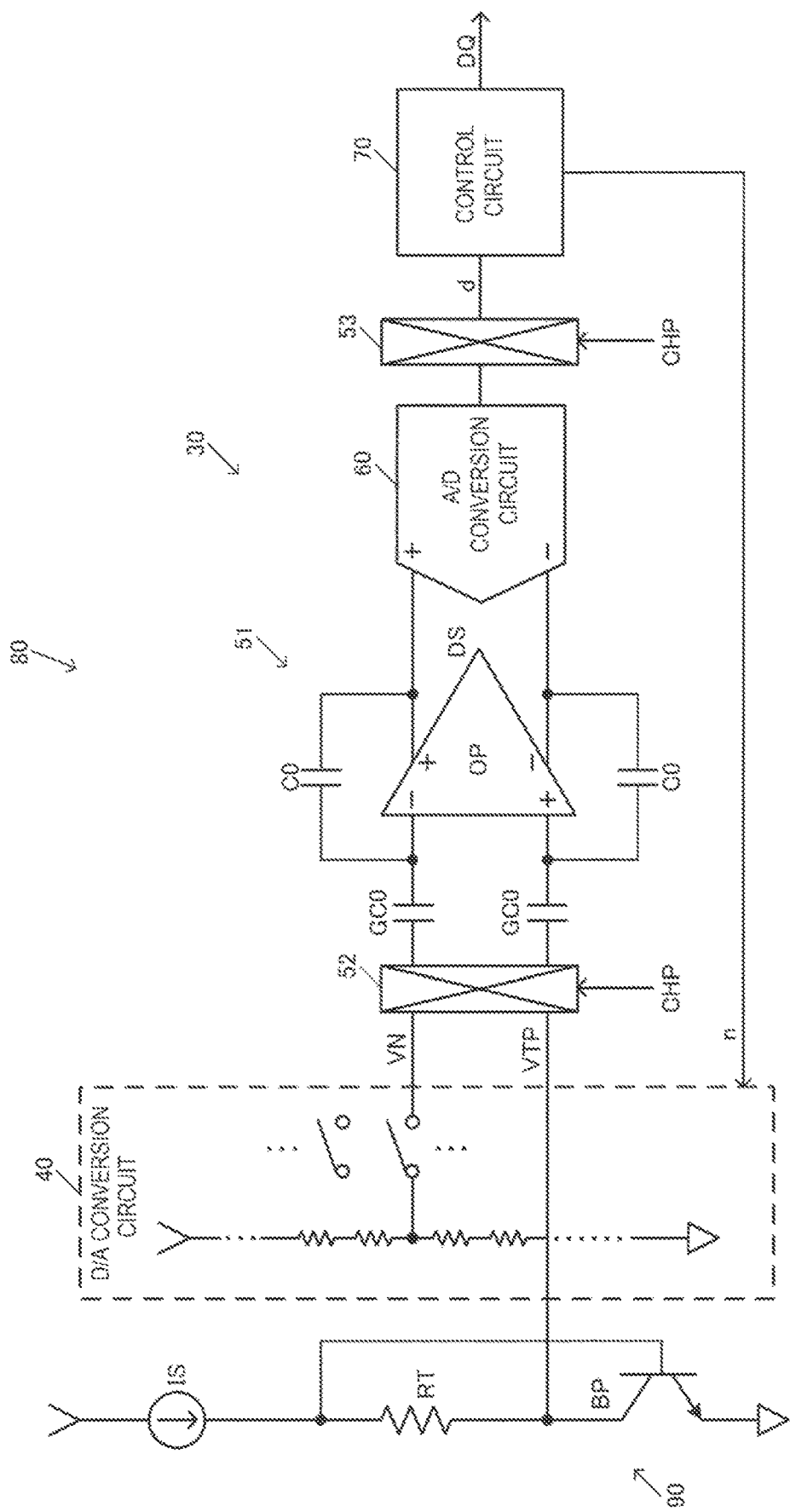
FIG. 14 is a diagram showing a detailed first configuration example of the digital-output temperature sensor.

FIG. 14 shows a detailed first configuration example of the digital-output temperature sensor 80. In FIG. 14, the temperature sensor circuit 90 outputs the temperature detection voltage VT as the temperature detection signal. Then, the temperature detection voltage VTP is input to the amplifier circuit 51 which is the difference output circuit 50 of the A/D converter 30 as the input signal VIN. Then, the amplifier circuit 51 performs the differential amplification operation of the DAC output voltage as the DAC output signal VN of the D/A conversion circuit 40, and the temperature detection voltage VTP, and then outputs the difference signals DS to the A/D conversion circuit 60. Thus, it is possible to realize the digital-output temperature sensor 80 which can perform the A/D conversion on the temperature detection voltage VTP as the temperature detection signal of the temperature sensor circuit 90 using the A/D converter 30, and then output the ADC result data DQ as a digital value.

Specifically, in FIG. 14, the temperature sensor circuit 90 includes a current source IS, a resistor RT, and a bipolar transistor BP disposed in series between the power supply node at the high potential side and the power supply node at the low potential side. A current from the current source IS flows through the resistor RT and the bipolar transistor BP. One end of the resistor RT is coupled to the base of the bipolar transistor BP, and the other end of the resistor RT is coupled to the collector of the bipolar transistor BP. Further, the temperature detection voltage VTP is output from a node of the collector of the bipolar transistor BP. The temperature sensor circuit 90 is a circuit making use of the fact that the forward voltage of the PN junction in the bipolar transistor BP has temperature dependency. Specifically, the temperature sensor circuit 90 is a circuit which outputs the temperature detection voltage VTP using a temperature characteristic of a base-emitter voltage of the bipolar transistor BP.

Further, in FIG. 14, chopping circuits 52, 53 are respectively disposed at an anterior side and a posterior side of the amplifier circuit 51 and the A/D conversion circuit 60. The chopping circuit 52 at the anterior side is a chopping circuit for modulation, and the chopping circuit 53 at the posterior side is a chopping circuit for demodulation. By the chopping circuits 52, 53 respectively disposed at the anterior side and the posterior side of the amplifier circuit 51 and the A/D conversion circuit 60 in such a manner performing chopping operation based on a chopping control signal CHP, it becomes possible to modulate the noise generated in the amplifier circuit 51 and the A/D conversion circuit 60 with a high frequency. Thus, it becomes possible to reduce the noise of the A/D converter 30 to realize a further increase in accuracy of the A/D converter 30.

Figure 15:
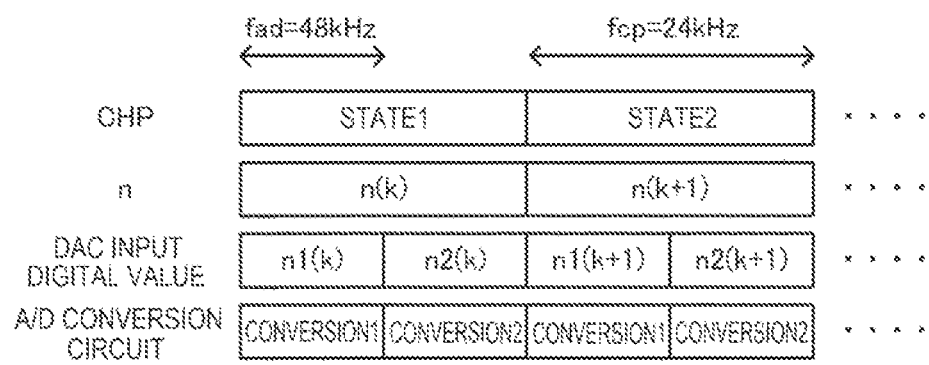
FIG. 15 is an operation explanatory diagram of the digital-output temperature sensor.

FIG. 15 is an operation explanatory diagram of the digital-output temperature sensor 80 shown in FIG. 14. A state of the chopping operation is switched between a state and a state 2. Here, the frequency of the chopping operation is, for example, fcp=24 kHz. Further, for example, in the state 1 of the chopping operation, the k-th processing described with reference to FIG. 5 is performed, and the control circuit 70 outputs n1($k$), n2($k$) as the DAC input digital values n(k), and the D/A conversion circuit 40 performs the D/A conversion of n1($k$), n2($k$). Then, the A/D conversion circuit 60 performs the A/D conversion twice to output d1($k$), d2($k$) corresponding to n1($k$), n2($k$) to the control circuit 70, and the control circuit 70 outputs the ADC result data DQ as the temperature detection data. Further, in the state 2 of the chopping operation, the (k+1)-th processing described with reference to FIG. 5 is performed, and the control circuit 70 outputs n1($k$+1), n2($k$+1) as the DAC input digital values n(k+1), and the D/A conversion circuit 40 performs the D/A conversion of n1($k$+1), n2($k$+1). Then, the A/D conversion circuit 60 performs the A/D conversion twice to output d1($k$+1), d2($k$+1) corresponding to n1($k$+1), n2 (k+1) to the control circuit 70, and the control circuit 70 outputs the ADC result data DQ as the temperature detection data.

As described above, in FIG. 15, the conversion frequency of the A/D conversion circuit 60 is fad=48 kHz, and is set, for example, twice as high as the frequency fcp=24 kHz of the chopping operation. The conversion frequency of the A/D conversion circuit 60 is also called a sampling frequency or a conversion rate. Further, the temperature detection data as the ADC result data DQ becomes to be output from the A/D converter 30 with a period corresponding to fcp=24 kHz.

Further, in the present embodiment, it is possible to adopt a configuration in which the temperature sensor circuit 90 detects the temperature to output the temperature detection current, and the temperature detection current is input to the difference output circuit 50 as the input current. Thus, it is possible to realize the digital-output temperature sensor 80 which can convert the temperature detection current as the temperature detection result of the temperature sensor circuit 90 into the ADC result data DQ as a digital value, and then output the result.

Figure 16:
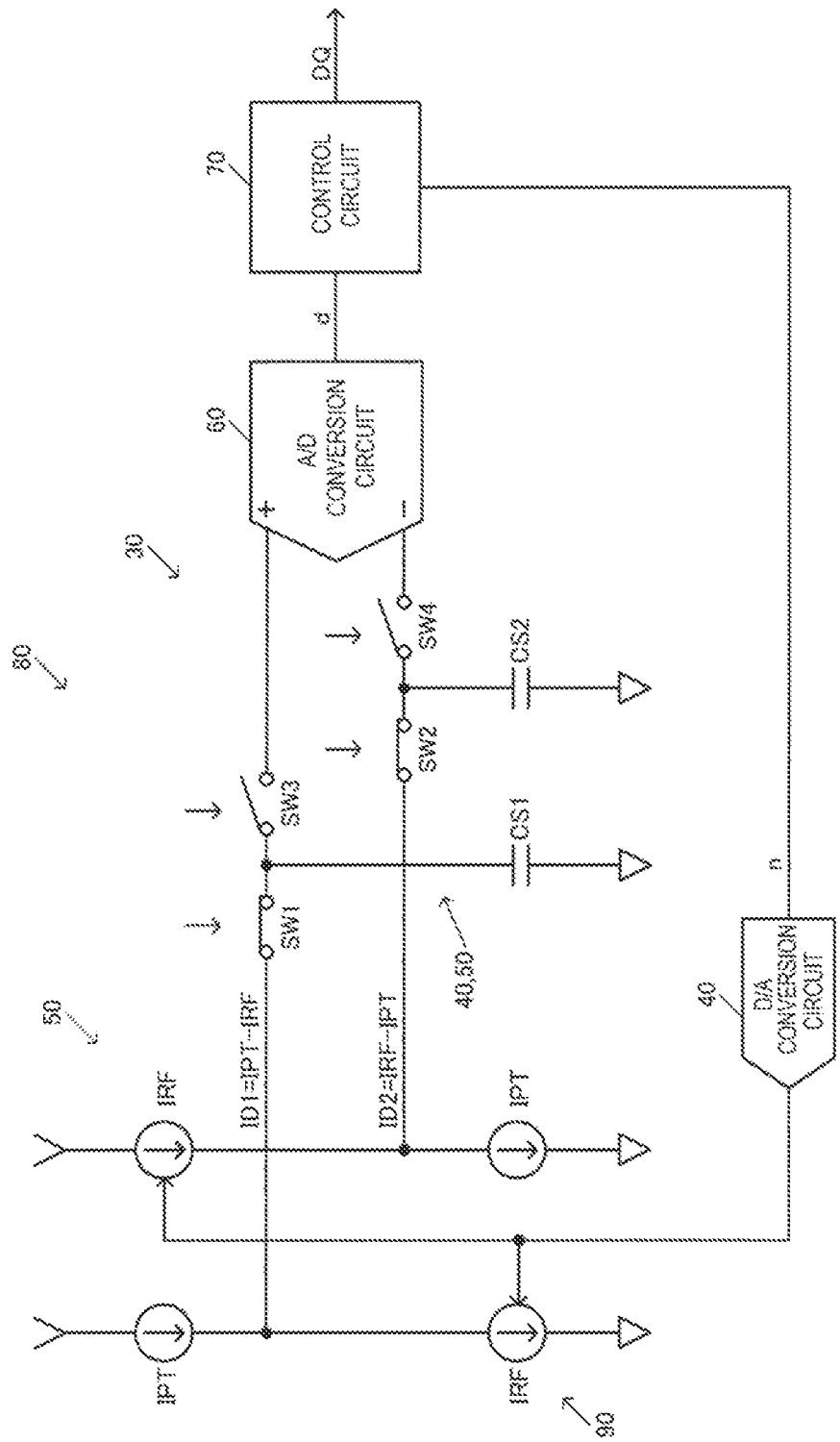
FIG. 16 is a diagram showing a detailed second configuration example of the digital-output temperature sensor.

For example, in FIG. 16, the temperature sensor circuit 90 described with reference to FIG. 14 outputs the temperature detection current IPT. The temperature detection current IPT is a current which has the temperature dependency, and is generated making use of the fact that the forward voltage of the PN junction in the bipolar transistor BP has the temperature dependency as shown in, for example, FIG. 14. In contrast, a reference current IRF corresponds to the DAC output signal VN in FIG. 1 and so on. For example, the D/A conversion circuit 40 of a current-output type generates the reference current IRF as the DAC output signal VN based on the DAC input digital value n from the control circuit 70. Such a D/A conversion circuit 40 of the current-output type can be realized by a D/A conversion circuit of a voltage-output type such as a resistor-ladder type for converting, for example, the DAC input digital value n into the DAC output voltage, and a voltage/current conversion circuit for converting the DAC output voltage of the D/A conversion circuit into the reference current IRF.

Further, the difference output circuit 50 outputs a difference current ID1=IPT-IRF and a difference current ID2=IRF-IPT based on a difference between the temperature detection current IPT and the reference current IRF. The difference current ID1=IPT-IRF is a first difference current, and is, for example, a difference current of a positive polarity side. The difference current ID2=IRF-IPT is a second difference current, and is, for example, a difference current of a negative polarity side. These difference currents ID1=IPT-IRF, ID2=IRF-IPT are converted into the first difference voltage and the second difference voltage by the current/voltage conversion circuit constituted by switches SW1, SW2, SW3, and SW4 and capacitors CS1, CS2. It is possible for the current/voltage conversion circuit to be a constituent of, for example, the A/D conversion circuit 60.

As described above, in FIG. 16, the input signal VIN is the input current, and the D/A conversion circuit 40 outputs a DAC output current obtained by performing the D/A conversion on the DAC input digital value n as the DAC output signal VN. For example, in FIG. 16, the D/A conversion circuit 40 outputs the reference current IRF as the DAC output current. Further, the difference output circuit 50 outputs the difference between the input current and the DAC output current as the difference signals DS. For example, in the difference output circuit 50, the temperature detection current IPT is input as the input current, the reference current IRF is input as the DAC output current, and the difference currents ID1=IPT-IRF, ID2=IRF-IPT as a differential pair of the input current and the DAC output current are output as the difference signals DS. In this way, it becomes possible to perform the A/D conversion on the value of the input current with high resolution to output the result as the ADC result data DQ also when the input signal VIN is the input current such as the temperature detection current IPT.

3. Circuit Device

Figure 17:
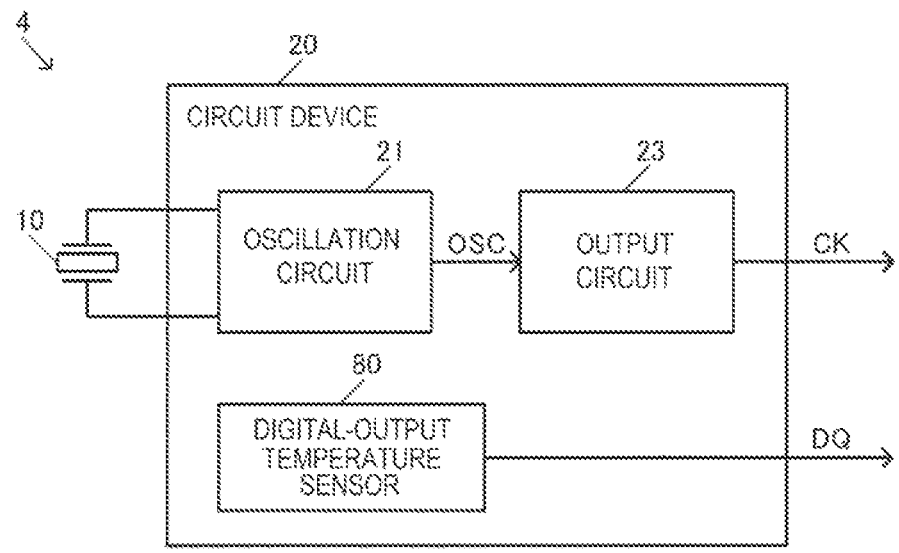
FIG. 17 is diagram showing a first configuration example of a circuit device including the digital-output temperature sensor.

FIG. 17 shows a first configuration example of a circuit device 20 according to the present embodiment. The circuit device 20 includes the digital-output temperature sensor 80 according to the present embodiment, and an oscillation circuit 21 for oscillating a resonator 10. Further, the circuit device 20 can include an output circuit 23 for outputting a clock signal CK based on an oscillation signal OSC from the oscillation circuit 21. Further, an oscillator 4 in the present embodiment includes the resonator 10 and the circuit device 20. The resonator 10 is electrically coupled to the circuit device 20. The resonator 10 and the circuit device 20 are electrically coupled to each other using, for example, internal interconnections of a package for housing the resonator 10 and the circuit device 20, and bonding wires or metal bumps.

The resonator 10 is an element for generating a mechanical vibration due to an electrical signal. The resonator 10 can be realized by a resonator element such as a quartz crystal resonator element. The resonator 10 can be realized by, for example, a quartz crystal resonator element which has a cutting angle of AT-cut or SC-cut, and vibrates in a thickness-shear mode, a tuning-fork quartz crystal resonator element, or a double tuning-fork quartz crystal resonator element. The resonator 10 can be, for example, a resonator incorporated in a temperature-compensated crystal oscillator (TCXO) not equipped with the constant-temperature oven, or a resonator incorporated in an oven-controlled crystal oscillator (OCXO) equipped with a constant-temperature oven. Alternatively, the resonator 10 can be a resonator incorporated in an oscillator such as an SPXO (Simple Packaged Crystal Oscillator). It should be noted that the resonator 10 according to the present embodiment can be realized by a variety of resonator elements such as a resonator element other than the thickness-shear vibration type, the tuning-fork type, or the double tuning-fork type, or a piezoelectric resonator element formed of a material other than quartz crystal. As the resonator 10, it is also possible to adopt, for example, an SAW (Surface Acoustic Wave) resonator, or an MEMS (micro electro-mechanical systems) resonator as a silicon resonator formed using a silicon substrate.

The circuit device 20 is an IC (Integrated Circuit) manufactured using, for example, a semiconductor process, and is a semiconductor chip having circuit elements formed on a semiconductor substrate. In FIG. 17, the circuit device 20 includes the oscillation circuit 21, the output circuit 23, and the digital-output temperature sensor 80.

The oscillation circuit 21 is a circuit for oscillating the resonator 10. The oscillation circuit 21 is electrically coupled to the resonator 10 via, for example, a first terminal and a second terminal for coupling the resonator, and oscillates the resonator 10 to generate the oscillation signal OSC. The first terminal and the second terminal are, for example, pads of the circuit device 20. For example, the oscillation circuit 21 can be realized by a drive circuit for oscillation disposed between the first terminal and the second terminal for coupling the resonator, and passive elements such as a capacitor and a resistor. The drive circuit can be realized by, for example, a COMS inverter circuit or a bipolar transistor. The drive circuit is a core circuit of the oscillation circuit 21, and the drive circuit performs voltage drive or current drive of the resonator 10 to thereby oscillate the resonator 10. As the oscillation circuit 21, there can be used a variety of types of oscillation circuit such as an inverter type, a Pierce type, a Colpitts type, and a Hartley type. It should be noted that the coupling in the present embodiment is electrical coupling. The electrical coupling means coupling capable of transmitting an electrical signal, and is coupling with which transmission of information by the electrical signal is achievable. The electrical coupling can also be coupling via a passive element or the like.

The output circuit 23 outputs the clock signal CK based on the oscillation signal OSC. For example, the output circuit 23 buffers the oscillation signal OSC, and then outputs the oscillation signal OSC to the outside as the clock signal CK. For example, the output circuit 23 outputs the clock signal CK in a single-ended CMOS signal format. It should be noted that it is possible to arrange that the output circuit 23 outputs the clock signal CK in a signal format other than the CMOS format. For example, it is possible for the output circuit 23 to output differential clock signals to the outside in a signal format such as LVDS (Low Voltage Difference signaling), PECL (Positive Emitter Coupled Logic), HCSL (High Speed Current Steering Logic), or differential CMOS (Complementary MOS).

The digital-output temperature sensor 80 detects, for example, the ambient temperature of the resonator 10 to output the ADC result data DQ as the temperature detection data. For example, the digital-output temperature sensor 80 detects the temperature in a surrounding area to thereby detect the ambient temperature of the resonator 10, and then outputs the ADC result data DQ to the outside as the temperature detection data. In this way, it becomes possible to realize the circuit device 20 capable of detecting the ambient temperature of the resonator 10 to output the result as the temperature detection data. It should be noted that in this case, it is possible to arrange to constitute a PLL loop or the like with, for example, an external system to perform a temperature compensation of the oscillation frequency of the resonator 10 based on the temperature detection data to thereby realize the temperature compensation of the clock signal CK.

Figure 18:
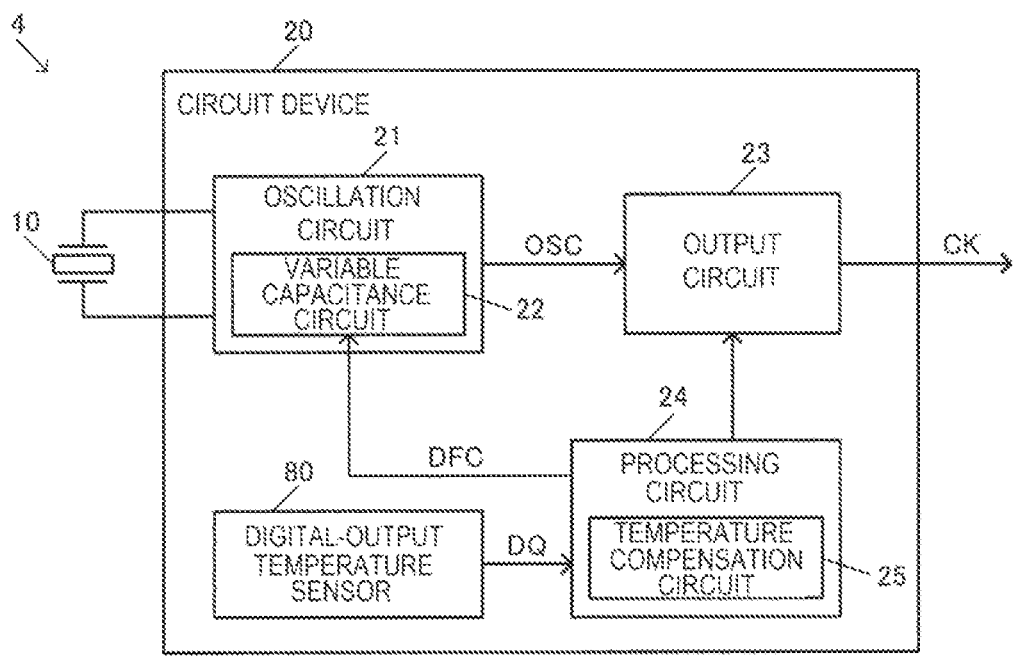
FIG. 18 is diagram showing a second configuration example of the circuit device including the digital-output temperature sensor.

FIG. 18 shows a second configuration example of the circuit device 20. In FIG. 18, the circuit device 20 includes a processing circuit 24 for outputting frequency control data DFC based on the temperature detection data as the ADC result data DQ of the digital-output temperature sensor 80. Further, the oscillation circuit 21 outputs the oscillation signal OSC with the oscillation frequency corresponding to the frequency control data DFC. In this way, it becomes possible to detect the ambient temperature of the resonator 10 with the temperature detection data of the digital-output temperature sensor 80 to control the oscillation frequency of the oscillation circuit 21. It becomes possible to perform the temperature compensation of the oscillation frequency of the resonator 10 to realize, for example, the temperature compensation of the clock signal CK.

Specifically, the processing circuit 24 includes a temperature compensation circuit 25. The temperature compensation circuit 25 performs the temperature compensation process based on the temperature detection data as the ADC result data DQ from the digital-output temperature sensor 80 to output the frequency control data DFC. The temperature compensation process is, for example, processing of suppressing the fluctuation of the oscillation frequency due to the temperature fluctuation to thereby compensate the oscillation frequency. In other words, the temperature compensation circuit 25 performs the temperature compensation process of the oscillation frequency of the oscillation circuit 21 so that the frequency becomes constant even when the temperature fluctuation occurs. For example, the temperature compensation circuit 25 performs the temperature compensation process of obtaining the frequency control data DFC from the temperature detection data using a lookup table representing the correspondence between the temperature detection data and the frequency control data DFC. Specifically, the oscillation circuit 21 includes a variable capacitance circuit 22, and by the capacitance value of the variable capacitance circuit 22 being adjusted based on the frequency control data DFC from the processing circuit 24, the temperature compensation process of the oscillation frequency of the oscillation circuit 21 is realized. Here, the variable capacitance circuit 22 includes, for example, a capacitor array having a plurality of capacitors, and a switch array having a plurality of switches, and pairs of each of the capacitors and corresponding one of the switches are coupled in series between a node of the first terminal or the second terminal for coupling the resonator and, for example, a ground node. Further, capacitance values of the respective capacitors of the capacitor array are binary-weighted. Further, the switches of the switch array are each set to the ON state or the OFF state based on the frequency control data DFC from the processing circuit 24. Thus, the capacitance value of the variable capacitance circuit 22 is controlled to adjust the oscillation frequency of the oscillation circuit 21, and thus, the temperature compensation process is realized.

Figure 19:
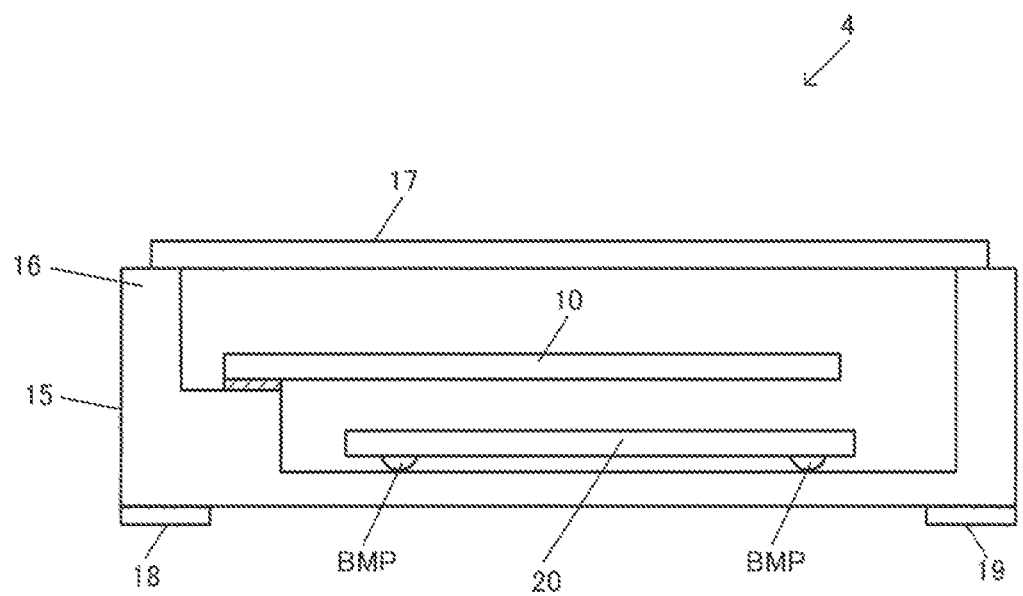
FIG. 19 is a diagram showing a structural example of an oscillator.

FIG. 19 shows a structural example of the oscillator 4 according to the present embodiment. The oscillator 4 according to the present embodiment includes the circuit device 20 and the resonator 10. Specifically, the oscillator 4 has the resonator 10, the circuit device 20, and a package 15 for housing the resonator 10 and the circuit device 20. The package 15 is formed of, for example, ceramics, and has a housing space inside, and the resonator 10 and the circuit device 20 are housed in the housing space. The housing space is airtightly sealed, and is set to a reduced-pressure state, desirably a state approximate to a vacuum state. Due to the package 15, it is possible to protect the resonator 10 and the circuit device 20 from an impact, dust, heat, moisture, and so on in good condition.

The package 15 has a base 16 and a lid 17. Specifically, the package 15 is constituted by the base 16 for supporting the resonator 10 and the circuit device 20, and the lid 17 bonded to an upper surface of the base 16 so that the housing space is formed between the base 16 and the lid 17. Further, the resonator 10 is supported by a step part disposed inside the base 16 via terminal electrodes. Further, the circuit device 20 is disposed on an inner bottom surface of the base 16. Specifically, the circuit device 20 is disposed so that an active surface faces to the inner bottom surface of the base 16. The active surface is a surface on which the circuit elements of the circuit device 20 are formed. Further, bumps BMP are provided to the pads as the terminals of the circuit device 20. Further, the circuit device 20 is supported by the inner bottom surface of the base 16 via the bumps BMP having electrical conductivity. The bumps BMP having electrical conductivity are, for example, metal bumps, and the resonator 10 and the circuit device 20 are electrically coupled to each other via the bumps BMP, internal interconnections and the terminal electrodes of the package 15, and so on. Further, the circuit device 20 is electrically coupled to external terminals 18, 19 as external coupling terminals of the oscillator 4 via the bumps BMP and the internal interconnections of the package 15. The external terminals 18, 19 are formed on an outer bottom surface of the package 15. The external terminals 18, 19 are coupled to an external device via external wiring. The external wiring is, for example, interconnections provided to the circuit board on which the external device is mounted. Thus, it becomes possible to output the clock signal and so on to the external device.

It should be noted that although in FIG. 19, the circuit device 20 is flip-mounted so that the active surface of the circuit device 20 faces downward, the present embodiment is not limited to such a mounting arrangement. It is possible to mount the circuit device 20 so that, for example, the active surface of the circuit device 20 faces upward. In other words, the circuit device 20 is mounted so that the active surface is opposed to the resonator 10. Alternatively, the oscillator 4 can be an oscillator in a wafer-level package (WLP). In this case, the oscillator 4 includes a base having a semiconductor substrate, and through electrodes penetrating the semiconductor substrate between a first surface and a second surface thereof, the resonator 10 fixed to the first surface of the semiconductor substrate via an electrically conductive bonding members such as metal bumps, and external terminals disposed at the second surface side of the semiconductor substrate via an insulating layer such as a relocation wiring layer. Further, an integrated circuit forming the circuit device 20 is formed on the first surface or the second surface of the semiconductor substrate. In this case, a first semiconductor wafer provided with a plurality of bases on which the resonator 10 and the integrated circuit are disposed, and a second semiconductor wafer provided with a plurality of lids are bonded to each other to thereby bond the plurality of bases and the plurality of lids to each other, and then, segmentalization of the oscillators 4 is performed with a dicing saw or the like. In this way, it becomes possible to realize the oscillator 4 in the wafer-level package, and thus, it becomes possible to manufacture the oscillator 4 with high throughput and at low cost.

As described hereinabove, the A/D converter according to the present embodiment performs an A/D conversion on an input signal to output ADC result data. Further, the A/D converter includes a D/A conversion circuit configured to perform a D/A conversion on a DAC input digital value to output a DAC output signal, a difference output circuit configured to output difference signals based on a difference between the input signal and the DAC output signal, an A/D conversion circuit configured to perform an A/D conversion on the difference signals to output an ADC output digital value, and a control circuit configured to output the DAC input digital value based on the ADC output digital value. Further, the control circuit outputs a first DAC input digital value and a second DAC input digital value different from the first DAC input digital value as the DAC input digital value, and obtains the ADC result data based on a first ADC output digital value as the ADC output digital value obtained in accordance with the first DAC input digital value, a second ADC output digital value as the ADC output digital value obtained in accordance with the second DAC input digital value, and the DAC input digital value.

According to the present embodiment, the A/D conversion based on the first DAC input digital value and the A/D conversion based on the second DAC input digital value are performed. Further, the conclusive ADC result data is obtained based on the first ADC output digital value as an A/D conversion result based on the first DAC input digital value, and the second ADC output digital value as an A/D conversion result based on the second DAC input digital value. Further, the first ADC output digital value can be obtained by performing the A/D conversion on a difference between the input signal and the DAC output signal obtained by performing the D/A conversion on the first DAC input digital value. Further, the second ADC output digital value can be obtained by performing the A/D conversion on a difference between the input signal and the DAC output signal obtained by performing the D/A conversion on the second DAC input digital value. In this way, it becomes possible to realize the A/D converter capable of performing the A/D conversion having higher accuracy than the resolution of the A/D conversion circuit using the A/D conversion circuit and the D/A conversion circuit, and thus, it is possible to realize an increase in accuracy of the A/D converter.

Further, in the present embodiment, defining the first DAC input digital value as $n1$, the second DAC input digital value as $n2$, the first ADC output digital value as $d1$, the second ADC output digital value as $d2$, and the ADC result data as DQ, the control circuit may obtain the ADC result data as $DQ = n1 + (n2-n1) \times d1/(d1-d2)$.

In this way, by the A/D conversion circuit and the D/A conversion circuit performing a conversion based on the first DAC input digital value and a conversion based on the second DAC input digital value, and the control circuit performing the following arithmetic processing, it becomes possible to realize the A/D converter having higher accuracy than the resolution of the A/D conversion circuit.

$$DQ = n1 + (n2-n1) \times d1/(d1-d2)$$

Further, in the present embodiment, the control circuit may include an arithmetic circuit configured to perform calculation of obtaining $d=d1/(d1-d2)$ based on the ADC output digital value d1 and the ADC output digital value d2, an integrator configured to perform integration processing on an output of the arithmetic circuit, and a quantizer configured to perform quantization processing on a result of the integration processing to output the DAC input digital value.

In this way, it becomes possible to perform a modulation on the DAC input digital value, and the DAC input digital value to the D/A conversion circuit becomes to be prevented from being fixed to a single value, and therefore, it is possible to improve the linearity and the differential characteristic of the D/A conversion circuit.

Further, in the present embodiment, the control circuit may output the second DAC input digital value obtained by adding a predetermined value to the first DAC input digital value.

In this way, by such simple processing as adding the predetermined value, it becomes possible to output the first DAC input digital value and the second DAC input digital value to the D/A conversion circuit, and output the first ADC output digital value corresponding to the first DAC input digital value and the second ADC output digital value corresponding to the second DAC input digital value from the A/D conversion circuit.

Further, in the present embodiment, the D/A conversion circuit may be a resistor-ladder type D/A conversion circuit.

In this way, an accurate conversion using the resistor-ladder type D/A conversion circuit good in linearity characteristic becomes possible, and thus, it becomes possible to realize the high-accuracy A/D converter.

Further, in the present embodiment, the A/D conversion circuit may be a successive-approximation type A/D conversion circuit.

As described above, by using the successive-approximation type A/D conversion circuit as the A/D conversion circuit, it becomes possible to perform the wide-band A/D conversion, and it becomes easy to realize the increase in bandwidth of the A/D converter.

Further, in the present embodiment, the input signal may be an input voltage, the D/A conversion circuit may output a DAC output voltage obtained by performing the D/A conversion on the DAC input digital value as the DAC output signal, and the difference output circuit may be an amplifier circuit configured to differentially amplify the input voltage and the DAC output voltage.

When providing such an amplifier circuit, it becomes possible to input the difference signals obtained by amplifying a difference between the input signal and the DAC output signal to the A/D conversion circuit. Therefore, it becomes possible for the A/D conversion circuit to perform the A/D conversion on the difference signals in a wide amplitude range amplified by the amplifier circuit, and thus it becomes possible to realize the high-accuracy A/D conversion.

Further, in the present embodiment, the input signal may be an input current, the D/A conversion circuit may output a DAC output current obtained by performing the D/A conversion on the DAC input digital value as the DAC output signal, and the difference output circuit may output a difference between the input current and the DAC output current as the difference signals.

In this way, it becomes possible to perform the A/D conversion on the value of the input current with high resolution to output the result as the ADC result data also when the input signal is the input current.

Further, the present embodiment relates to a digital-output temperature sensor including the A/D converter described above, and a temperature sensor circuit configured to detect temperature to output a temperature detection voltage, wherein the temperature detection voltage is input to the difference output circuit as the input voltage.

In this way, it becomes possible to realize the digital-output temperature sensor which can convert the temperature detection voltage as the temperature detection result of the temperature sensor circuit into the ADC result data as a digital value, and then output the ADC result data.

Further, the present embodiment relates to a digital-output temperature sensor including the A/D converter described above, and a temperature sensor circuit configured to detect temperature to output a temperature detection current, wherein the temperature detection current is input to the difference output circuit as the input current.

In this way, it becomes possible to realize the digital-output temperature sensor which can convert the temperature detection current as the temperature detection result of the temperature sensor circuit into the ADC result data as a digital value, and then output the ADC result data.

Further, the present embodiment relates to a circuit device including the digital-output temperature sensor described above, and an oscillation circuit configured to oscillate a resonator, wherein the digital-output temperature sensor detects ambient temperature of the resonator to output ADC result data as temperature detection data.

In this way, it becomes possible to realize the circuit device capable of detecting the ambient temperature of the resonator to output the result as the temperature detection data.

Further, in the present embodiment, there may further be included a processing circuit configured to output frequency control data based on the temperature detection data, wherein the oscillation circuit may generate an oscillation signal with an oscillation frequency corresponding to the frequency control data.

In this way, it becomes possible to detect the ambient temperature of the resonator with the temperature detection data of the digital-output temperature sensor to control the oscillation frequency of the oscillation circuit.

Further, the present embodiment relates to an oscillator including the circuit device described above, and the resonator.

It should be noted that although the present embodiment is hereinabove described in detail, it should easily be understood by those skilled in the art that it is possible to make a variety of modifications not substantially departing from the novel matters and the advantages of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations, the operations, and so on of the A/D converter, the digital-output temperature sensor, the circuit device, and the oscillator are not limited to those described in the present embodiment, but can be implemented with a variety of modifications.

What is claimed is:

1. An A/D converter configured to perform an A/D conversion on an input signal to output ADC result data, the A/D converter comprising:
    a D/A conversion circuit configured to perform a D/A conversion on a DAC input digital value to output a DAC output signal;
    a difference output circuit configured to output difference signals based on a difference between the input signal and the DAC output signal;
    an A/D conversion circuit configured to perform an A/D conversion on the difference signals to output an ADC output digital value; and
    a control circuit configured to output the DAC input digital value based on the ADC output digital value, wherein
    the control circuit is configured to
        output a first DAC input digital value and a second DAC input digital value different from the first DAC input digital value as the DAC input digital value, and
        obtain the ADC result data based on a first ADC output digital value as the ADC output digital value obtained in accordance with the first DAC input digital value, a second ADC output digital value as the ADC output digital value obtained in accordance with the second DAC input digital value, and the DAC input digital value.

2. The A/D converter according to claim 1, wherein defining the first DAC input digital value as n1, the second DAC input digital value as n2, the first ADC output digital value as d1, the second ADC output digital value as d2, and the ADC result data as DQ, the control circuit is configured to obtain the ADC result data as $DQ=n1+(n2-n1) \times d1/(d1-d2)$.

3. The A/D converter according to claim 2, wherein the control circuit includes
    an arithmetic circuit configured to perform calculation of obtaining $d=d1/(d1-d2)$ based on the first ADC output digital value d1 and the second ADC output digital value d2,
    an integrator configured to perform integration processing on an output of the arithmetic circuit, and
    a quantizer configured to perform quantization processing on a result of the integration processing to output the DAC input digital value.

4. The A/D converter according to claim 1, wherein the control circuit is configured to output the second DAC input digital value obtained by adding a predetermined value to the first DAC input digital value.

5. The A/D converter according to claim 1, wherein the D/A conversion circuit is a resistor-ladder type D/A conversion circuit.

6. The A/D converter according to claim 1, wherein the A/D conversion circuit is a successive-approximation type A/D conversion circuit.

7. The A/D converter according to claim 1, wherein
    the input signal is an input voltage,
    the D/A conversion circuit is configured to output a DAC output voltage obtained by performing the D/A conversion on the DAC input digital value as the DAC output signal, and
    the difference output circuit is an amplifier circuit configured to differentially amplify the input voltage and the DAC output voltage.

8. The A/D converter according to claim 1, wherein
    the input signal is an input current,
    the D/A conversion circuit is configured to output a DAC output current obtained by performing the D/A conversion on the DAC input digital value as the DAC output signal, and
    the difference output circuit is configured to output a difference between the input current and the DAC output current as the difference signals.

9. A digital-output temperature sensor comprising:
    the A/D converter according to claim 7; and
    a temperature sensor circuit configured to detect temperature to output a temperature detection voltage, wherein
    the temperature detection voltage is input to the difference output circuit as the input voltage.

10. A digital-output temperature sensor comprising:
    the A/D converter according to claim 8; and
    a temperature sensor circuit configured to detect temperature to output a temperature detection current, wherein
    the temperature detection current is input to the difference output circuit as the input current.

11. A circuit device comprising:
    the digital-output temperature sensor according to claim 9; and
    an oscillation circuit configured to oscillate a resonator, wherein
    the digital-output temperature sensor is configured to detect ambient temperature of the resonator to output the ADC result data as temperature detection data.

12. The circuit device according to claim 11, further comprising:
    a processing circuit configured to output frequency control data based on the temperature detection data, wherein
    the oscillation circuit is configured to generate an oscillation signal with an oscillation frequency corresponding to the frequency control data.

13. An oscillator comprising:
    the circuit device according to claim 11; and
    the resonator.

* * * * *